(12) United States Patent
Williams et al.

(10) Patent No.: US 9,305,859 B2
(45) Date of Patent: Apr. 5, 2016

(54) INTEGRATED CIRCUIT DIE WITH LOW THERMAL RESISTANCE

(75) Inventors: Richard K. Williams, Cupertino, CA (US); Keng Hung Lin, Kaohsiung (TW)

(73) Assignees: ADVANCED ANALOGIC TECHNOLOGIES INCORPORATED, Santa Clara, CA (US); SKYWORKS SOLUTIONS (HONG KONG) LIMITED, Hong Kong (CN)

( * ) Notice: Subject to any disclaimer, the term of this patent is extended or adjusted under 35 U.S.C. 154(b) by 80 days.

(21) Appl. No.: 13/210,764

(22) Filed: Aug. 16, 2011

(65) Prior Publication Data

US 2013/0043572 A1 Feb. 21, 2013

(51) Int. Cl.
| | |
|---|---|
| H01L 23/367 | (2006.01) |
| H01L 23/433 | (2006.01) |
| H01L 23/495 | (2006.01) |
| H01L 21/48 | (2006.01) |
| H01L 23/00 | (2006.01) |

(52) U.S. Cl.
CPC ........ H01L 23/4334 (2013.01); H01L 21/4828 (2013.01); H01L 23/3677 (2013.01); H01L 23/49548 (2013.01); H01L 23/49568 (2013.01); H01L 24/05 (2013.01); H01L 24/16 (2013.01); H01L 2224/0401 (2013.01); H01L 2224/04042 (2013.01); H01L 2224/05096 (2013.01); H01L 2224/05572 (2013.01); H01L 2224/131 (2013.01); H01L 2224/16245 (2013.01); H01L 2224/48091 (2013.01); H01L 2224/48247 (2013.01); H01L 2224/48464 (2013.01); H01L 2224/81191 (2013.01); H01L 2224/81815 (2013.01); H01L 2924/00014 (2013.01); H01L 2924/13091 (2013.01); H01L 2924/3011 (2013.01); H01L 2924/3025 (2013.01)

(58) Field of Classification Search
CPC .................. H01L 23/34; H01L 23/367; H01L 2225/06541; H01L 2225/06589; H01L 2225/1094
USPC .................. 257/758, 774, E23.011, E23.145
See application file for complete search history.

(56) References Cited

U.S. PATENT DOCUMENTS

| | | | |
|---|---|---|---|
| 7,788,800 B2 | 9/2010 | Abbott | |
| 7,989,305 B2 | 8/2011 | Ohnuma et al. | |
| 2007/0187830 A1* | 8/2007 | Matsunaga et al. | 257/758 |
| 2007/0215996 A1* | 9/2007 | Otremba | 257/678 |

(Continued)

FOREIGN PATENT DOCUMENTS

| | | |
|---|---|---|
| RU | 2402107 C2 | 10/2010 |
| WO | 2005096372 A | 10/2005 |

OTHER PUBLICATIONS

International Search Report from corresponding PCT Application Serial No. PCT/US2012/050497, mailed Nov. 1, 2012.

(Continued)

*Primary Examiner* — Evan Pert
*Assistant Examiner* — Leslie Pilar Cruz
(74) *Attorney, Agent, or Firm* — Lando & Anastasi, LLP

(57) ABSTRACT

In a bump-on-leadframe semiconductor package a metal bump formed on a integrated circuit die is used to facilitate the transfer of heat generated in a semiconductor substrate to a metal heat slug and then to an external mounting surface. A structure including arrays of thermal vias may be used to transfer the heat from the semiconductor substrate to the metal bump.

19 Claims, 18 Drawing Sheets

(56) References Cited

U.S. PATENT DOCUMENTS

| | | | |
|---|---|---|---|
| 2007/0241432 A1* | 10/2007 | Shim et al. | 257/675 |
| 2007/0273010 A1* | 11/2007 | Holloway et al. | 257/666 |
| 2008/0211068 A1* | 9/2008 | Chen et al. | 257/666 |
| 2009/0045487 A1* | 2/2009 | Jung | 257/621 |
| 2011/0140126 A1* | 6/2011 | Gaul et al. | 257/77 |

OTHER PUBLICATIONS

Written Opinion from corresponding PCT Application Serial No. PCT/US2012/050497, mailed Oct. 11, 2012.

* cited by examiner

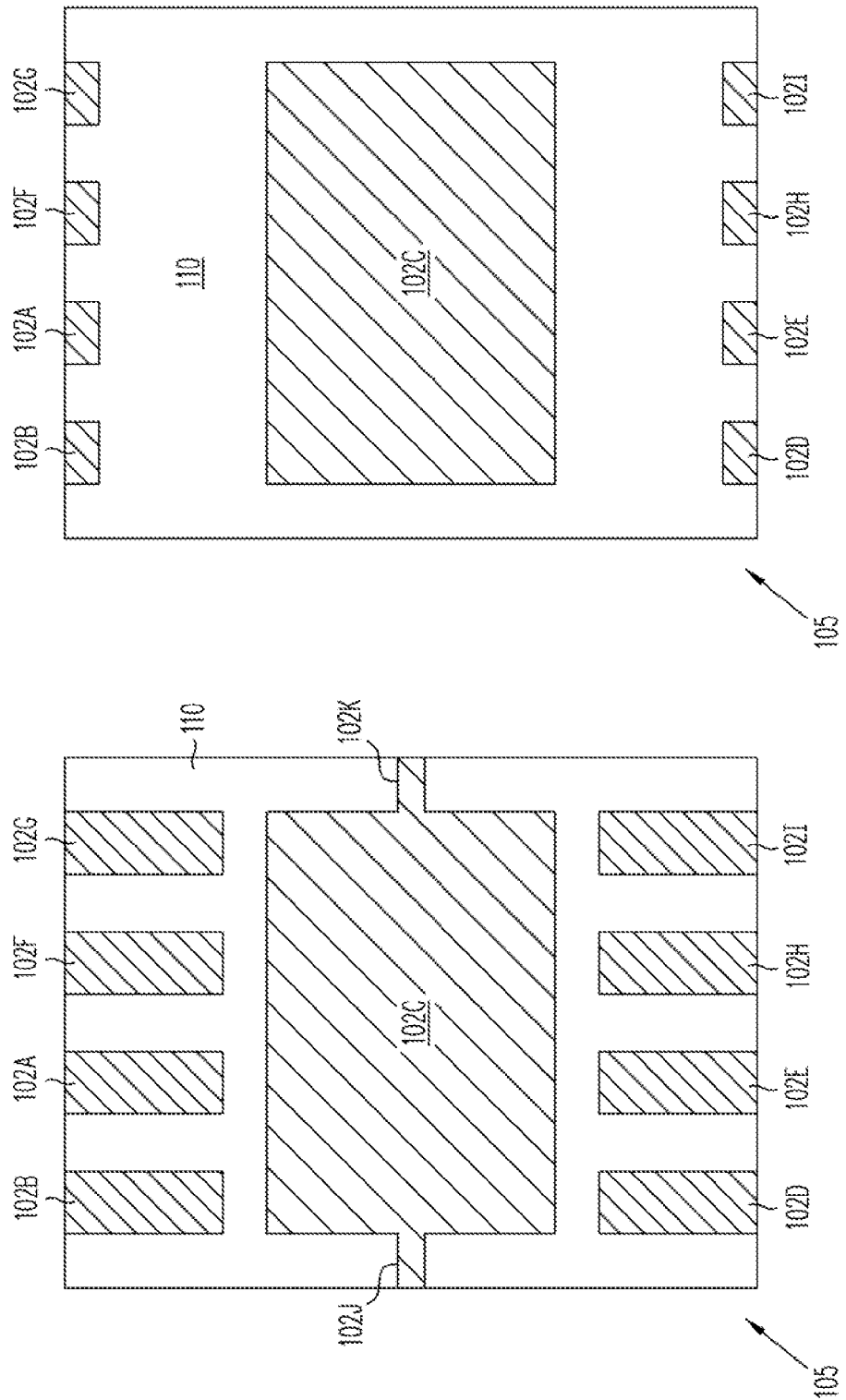

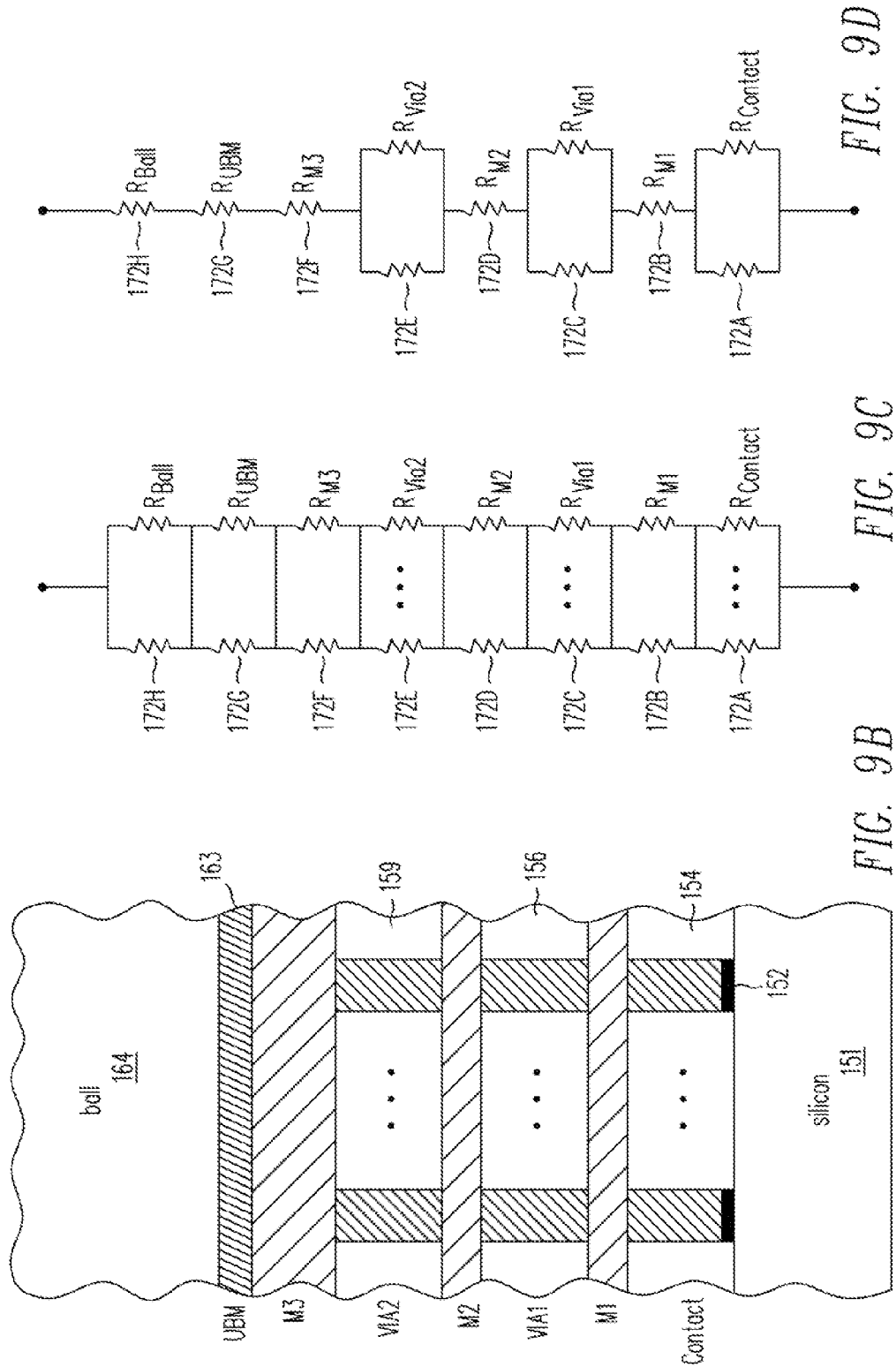

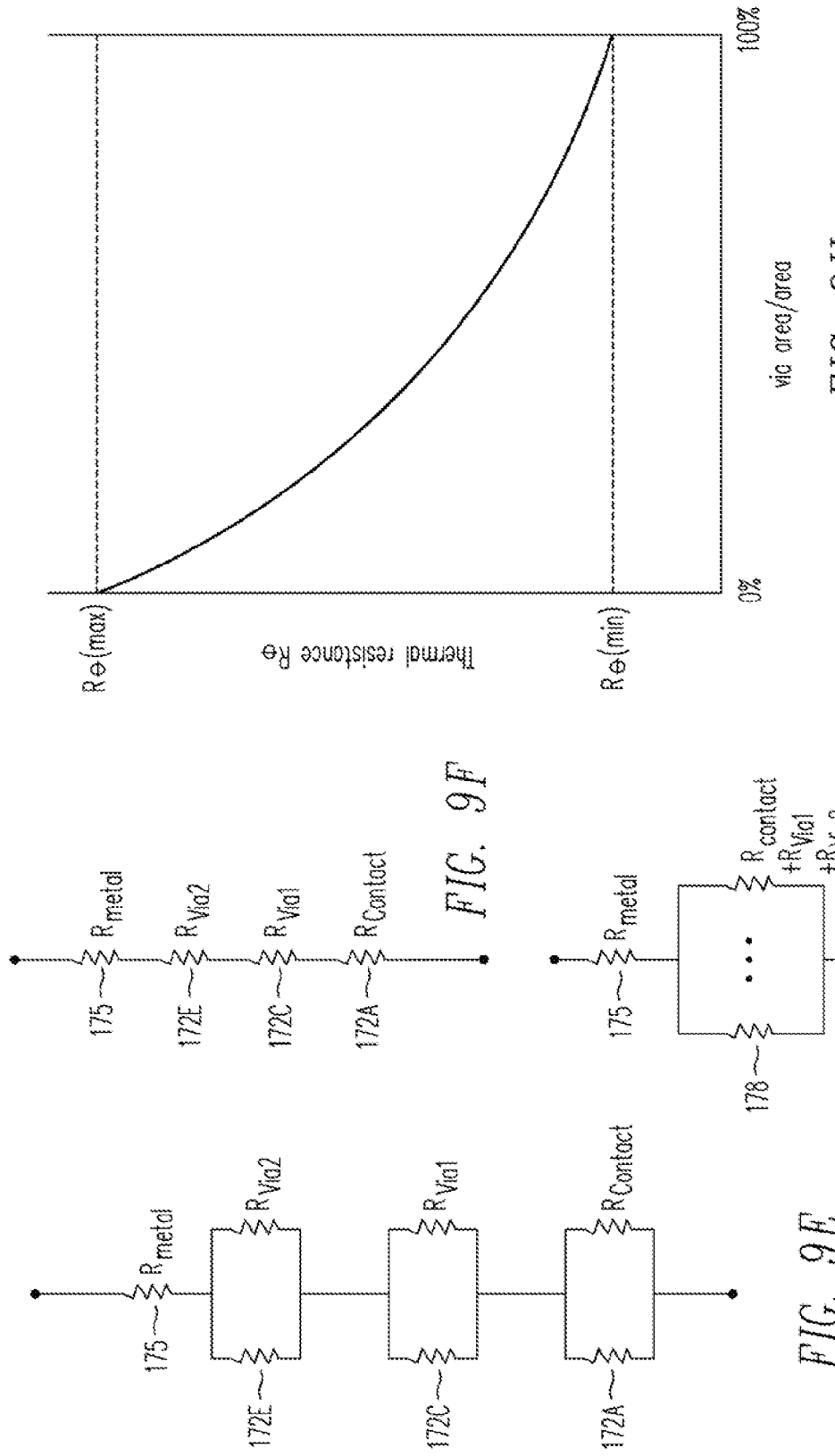

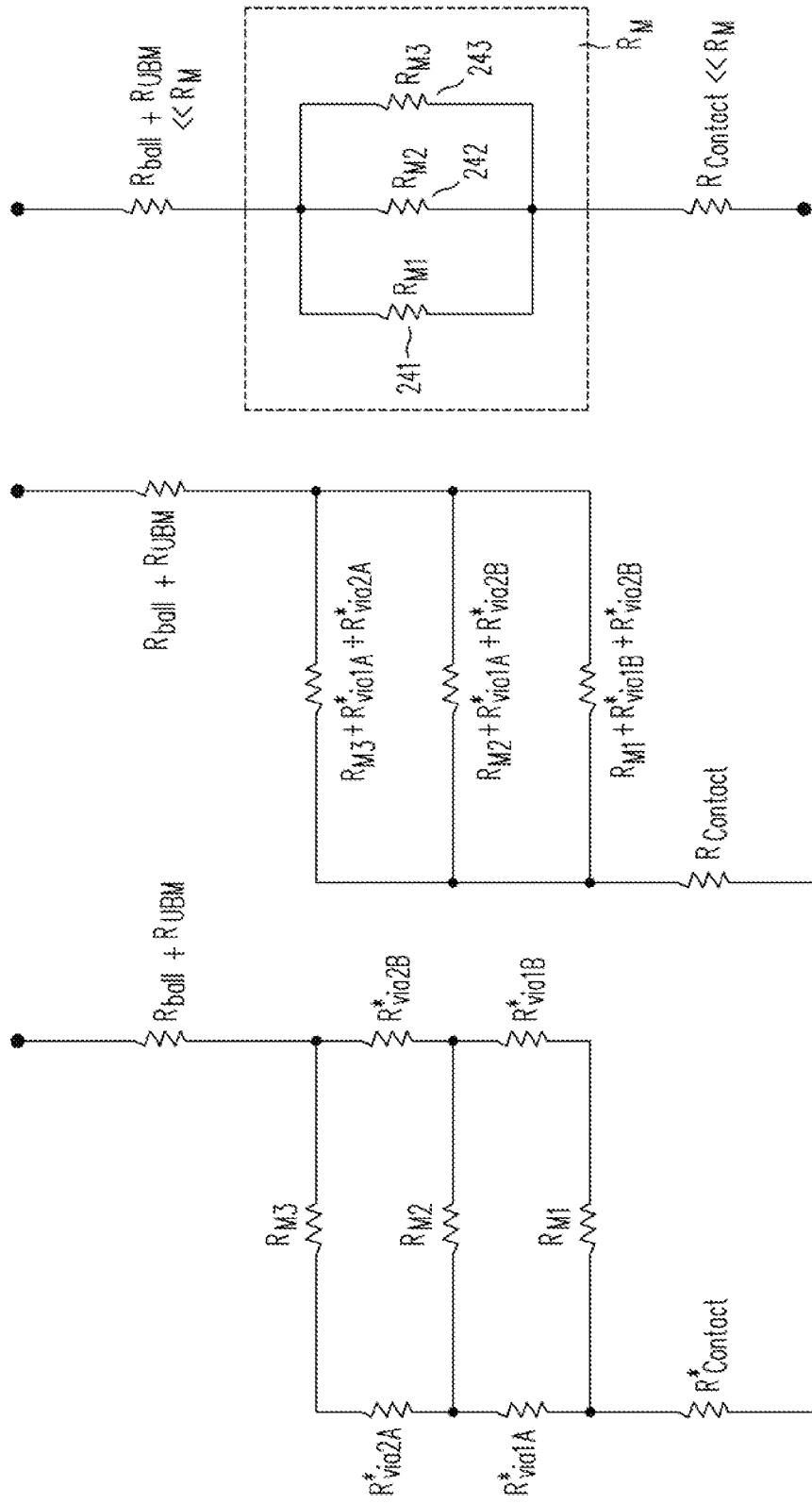

INTEGRATED CIRCUIT DIE WITH LOW THERMAL RESISTANCE

CROSS-REFERENCE TO RELATED APPLICATIONS

This application is related to application Ser. No. 11/381,292, filed May 2, 2006, titled "Bump-on-Leadframe (BOL) Package Technology with Reduced Parasitics," which is incorporated herein by reference in its entirety.

BACKGROUND OF THE INVENTION

Integrated circuit dice often contain devices (e.g., power MOSFETs) that generate a considerable amount of heat. When the dice are assembled into semiconductor packages, they are normally encased in a plastic molding compound, and this can make it difficult to remove that heat.

In wire-bonded packages, the heat removal can be facilitated by mounting the die onto a heat slug. For example, FIG. 1A is a cross-sectional view of a SOT-like package 1 that contains an integrated circuit die 3 encased in a plastic molding compound 5. SOT, an acronym for "small outline transistor", is a common plastic leaded package for housing semiconductor devices. Electrical connections between die 3 and leads 2A and 2C are made via bonding wires 4A and 4B, which are also embedded in molding compound 5. Leads 2A and 2B extend from the sides of molding compound 5 and are bent downward to form mounting surfaces that contact the backside surface 6 on which package 1 is mounted (e.g., a printed circuit board). To assist in heat removal, die 3 is mounted on a metal heat slug 2B. To insure good heat conduction from the die into the leadframe, die 3 has no backside oxide often requiring special steps to remove the backside oxide or to thin the wafer through mechanical grinding. Such a bottom surface may be referred to as the die's "bare" backside.

In many package implementations, leads 2A and 2C are not coplanar with the top of heat slug 2B. A bottom surface of heat slug 2B is exposed and also contacts the mounting surface 6. Since heat slug 2B is made of metal and has a relatively large cross-sectional area, it provides a broad, low-resistance thermal path by which heat generated in die 3 can escape to backside surface 6.

Similarly, FIG. 1B shows a cross-sectional view of a dual flat no-lead (DFN) package 11, which a die 13 is mounted on a heat slug 12B. Die 13 is connected to leads 12A and 12B by means for bonding wires 14A and 14B. Unlike leads 2A and 2B in package 1, leads 12A and 12B have external surfaces that are flush with the surfaces of molding compound 15. In particular the bottom surfaces of leads 12A and 12B are coplanar with the bottom surface of molding compound 15, allowing leads 12A and 12B to make direct contact with circuit elements on surface 6. Die 13 is mounted on a metal heat slug 12B, which is similar in structure to heat slug 2B, and provide a broad thermal path for heat to escape from die 13 to mounting surface 16. In many package implementations, leads 12A and 12C are not coplanar with the top of heat slug 12B.

FIG. 3A shows a plan view of package 11 (FIG. 1B is taken at cross-section 1B-1B shown in FIG. 3A). As shown, leads 12A, 12D, 12F and 12H are arranged in a row along a side 17A of molding compound 15 and leads 12C, 12E, 12G and 12I are arranged in a row along an opposite side 17B of molding compound 15. Bonding wires 14A and 14C-14I are also shown. Tie bars 16A and 16B originally connected heat slug 12B to the leadframe of which it was a part before package 11 was singulated.

In packages 1 and 11, relatively thin bonding wires are used to make electrical contact with pads (not shown) on the top surface of dice 3 and 13. These bonding wires can introduce a significant amount of resistance into the connections between the dice and the leads, and they are vulnerable to breakage. A more robust electrical connection with the pads can be made by turning the dice upside down so that the contact pads are facing downward, and making the connections with metal bumps or balls. FIGS. 2A and 2B illustrate cross-sectional views of SOT-like and DFN packages that are similar to packages 1 and 11, except that they are bump-on-leadframe (BOL) or "flip-chip" packages. SOT-like package 21, shown in FIG. 2A, contains a die 23 that is connected to leads 22A and 22B by means of metal bumps 24A and 24B. Die 23 and metal bumps 24A and 24B are encased in molding compound 25, and leads 22A and 22B extend from molding compound 25 in a manner similar to leads 2A and 2B in package 1. DFN package 31, shown in the cross-sectional view of FIG. 2B, contains a die 33 that is connected to leads 32A and 32B by means of metal bumps 34A and 34B. Die 33 and metal bumps 34A and 34B are encased in molding compound 35, and leads 32A and 32B have external surfaces that are flush with the surfaces of molding compound 35 in a manner similar to leads 12A and 12B in package 11.

FIG. 3B shows a plan view of package 31 (FIG. 2B is taken at cross-section 2B-2B shown in FIG. 3B). As shown, leads 32A, 32C, 32E and 32G are arranged in a row along a side 37A of molding compound 35 and leads 32B, 32D, 32F and 32H are arranged in a row along an opposite side 37B of molding compound 35. Metal bumps 34A-34H are also shown.

In the bump-on-leadframe packages 21 and 31, it is not feasible to provide a thermal escape path by mounting the dice 23 and 33 onto a heat slug in the manner of dice 3 and 13 in wire bond packages 1 and 11 because the back of the die does not face down toward the bottom of the package. Instead the die is "suspended", i.e. supported by bumps 24 or 34 acting as pillars and has its backside facing "up", away from the bottom of the package. Even if a heat slug were included in the package, there would be no obvious means to connect the bumps to the heat slug since the bumps or pillars are located at the die's periphery and the heat slug is located near the center of the die, and because in many exposed pad packages, the top of the heat slug is not coplanar with the leads.

What is needed, therefore, is a technique for combining the electrical advantages of a BOL package with the thermal advantages of mounting the die onto a heat slug.

BRIEF SUMMARY OF THE INVENTION

In the bump-on-leadframe semiconductor package of this invention, an integrated circuit (IC) die is oriented with its principal surface (the surface on which the contact pads are located) facing downward, i.e., towards the surface on which the package is mounted. The contact pads are located in a peripheral area of the principal surface. The principal surface also comprises a central area. The package comprises a metal heat slug, and a metal bump connects the heat slug and the central area of said principal surface. The die is encased in a molding compound, and the molding compound also encases at least a portion of the lead and at least a portion of the heat slug. A mounting surface of the lead is coplanar with a bottom surface of the heat slug. Thus, when the package is mounted on, for example, a printed circuit board, the exposed surface of the heat slug is in contact with the printed circuit board, thereby providing a low-resistance thermal path for heat to be conducted away from the die.

In another aspect of the invention, the IC die comprises a stack of interlayer dielectric layers and metal layers formed on the side of the principal surface of the die. The metal layers are formed at the interfaces between the interlayer dielectric layers. An array of metal-filled thermal vias connects the underlying semiconductor substrate to the first metal layer. A similar array of metal-filled thermal vias likewise connects each of the metal layers to the metal layer directly above it. The top metal layer is in contact with an under bump metal (UBM) layer to which the metal bump is attached. This structure operates in conjunction with the package structure described above to ensure that heat is readily conducted from the semiconductor substrate in which the heat-generating devices are formed to the metal bump and thence to the printed circuit board or other supporting structure.

BRIEF DESCRIPTION OF THE SEVERAL VIEWS OF THE DRAWING

The invention will be better understood by reference to the following drawings, which are not necessarily drawn to scale and in which like components have similar reference numerals.

FIG. 8A is a view of the package of FIG. 7E taken at cross-section 8A-8A.

FIG. 8B is a view of the package of FIG. 7E taken at cross-section 8B-8B.

FIG. 9B is a detailed cross-sectional view of a portion of the structure shown in FIG. 9A.

FIGS. 9C-9G show equivalent thermal resistance paths representing the structure of FIG. 9A in different ways.

FIG. 9H is a graph showing the total thermal resistance of the structure of FIG. 9A as a function of the percentage of the total area occupied by the thermal vias.

FIGS. 10D-10G show equivalent thermal resistance paths representing the structure of FIG. 10A in different ways.

DETAILED DESCRIPTION OF THE INVENTION

In a bump-on-leadframe (BOL) semiconductor package of this invention, thermal contact between an integrated circuit (IC) die and a heat slug is created through a metal bump. The metal bump is typically formed of solder, but other metals may also be used. Metal bumps (or balls) will sometimes be referred to herein as solder bumps (or balls) with the understanding the metals other than solder can be used in some embodiments. The term "balls" will be used to refer to the solder before reflow (described below); the term "bumps" will be used to refer to the solder after reflow.

Figure 1A:
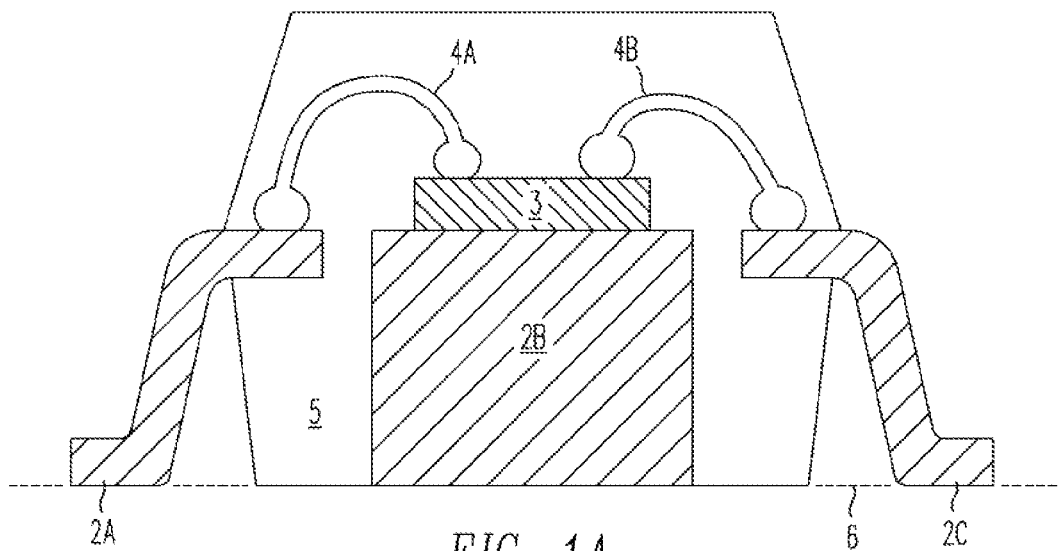
FIG. 1A shows a cross-sectional view of a conventional wire-bonded SOT-like semiconductor package containing a heat slug.
Figure 1B:
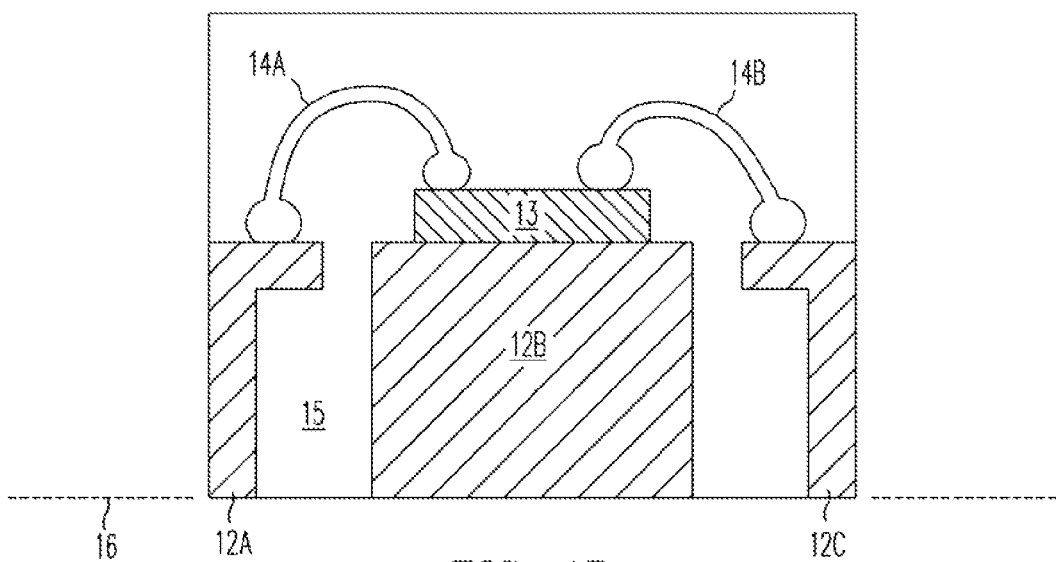
FIG. 1B shows a cross-sectional view of a conventional wire-bonded dual flat no-lead (DFN) semiconductor package containing a heat slug.
Figure 2A:
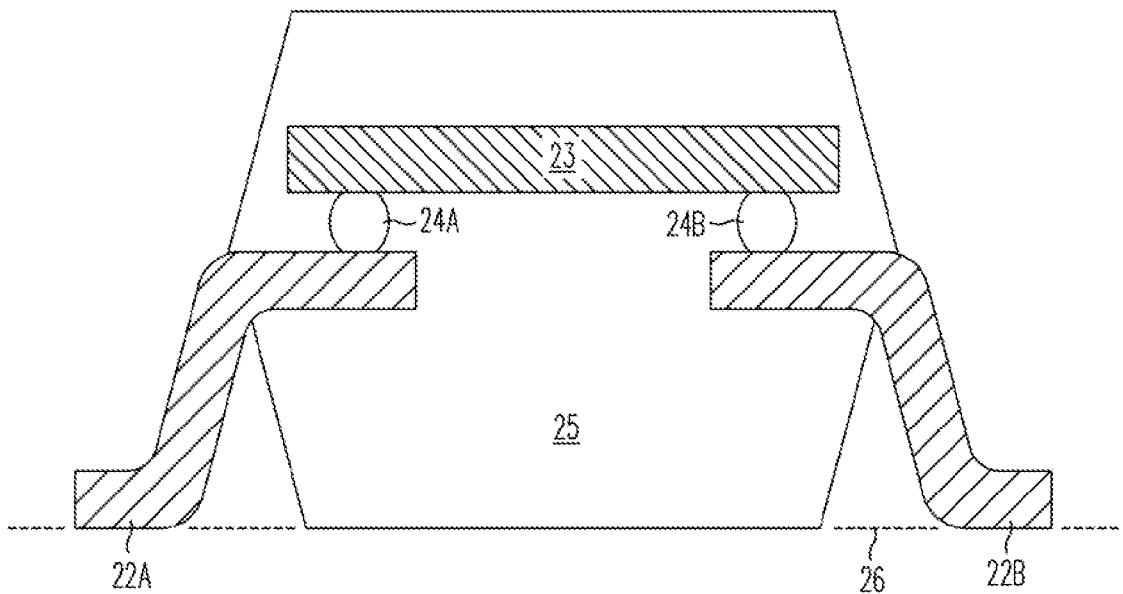
FIG. 2A shows a cross-sectional view of a conventional bump-on-leadframe (BOL) SOT-like semiconductor package.
Figure 2B:
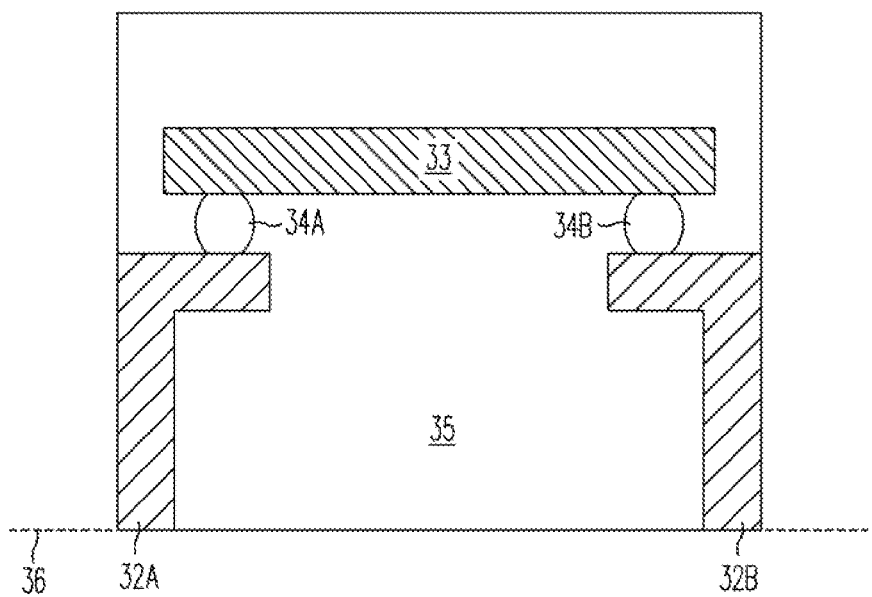
FIG. 2B shows a cross-sectional view of a conventional BOL DFN semiconductor package
Figure 3A:
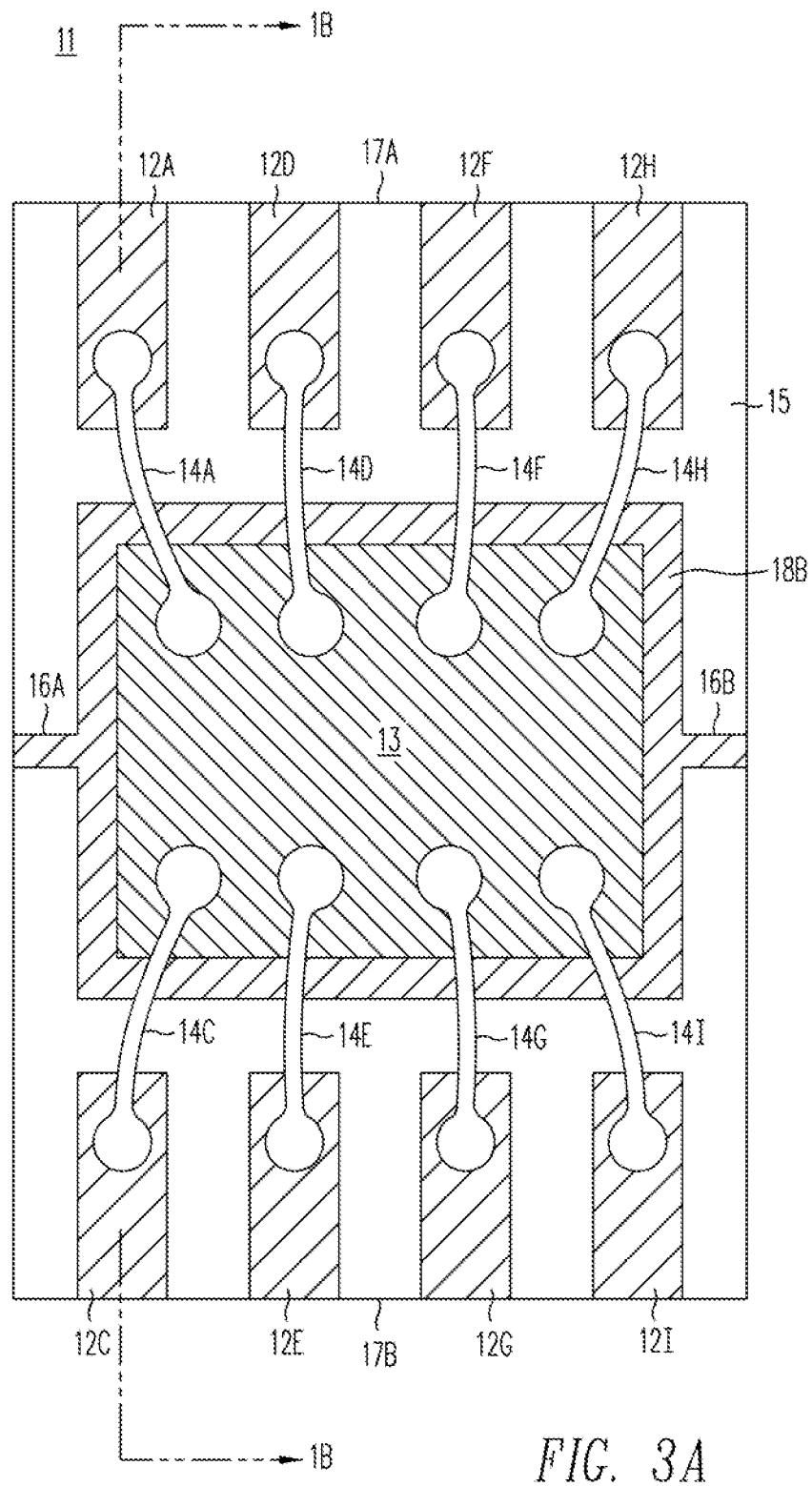
FIG. 3A shows a plan view of the package of FIG. 1B.
Figure 3B:
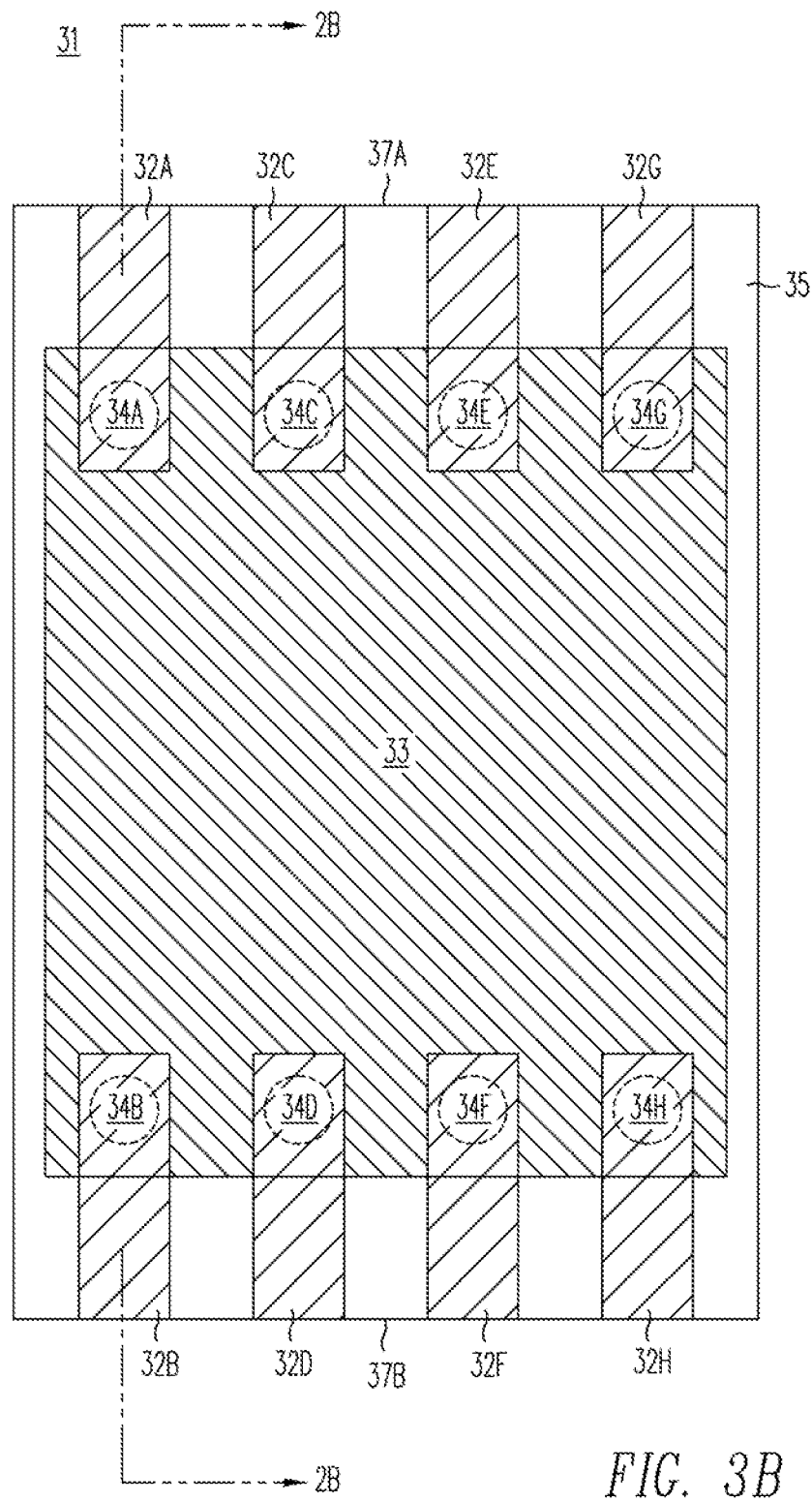
FIG. 3B shows a plan view of the package of FIG. 2B.
Figure 4A:
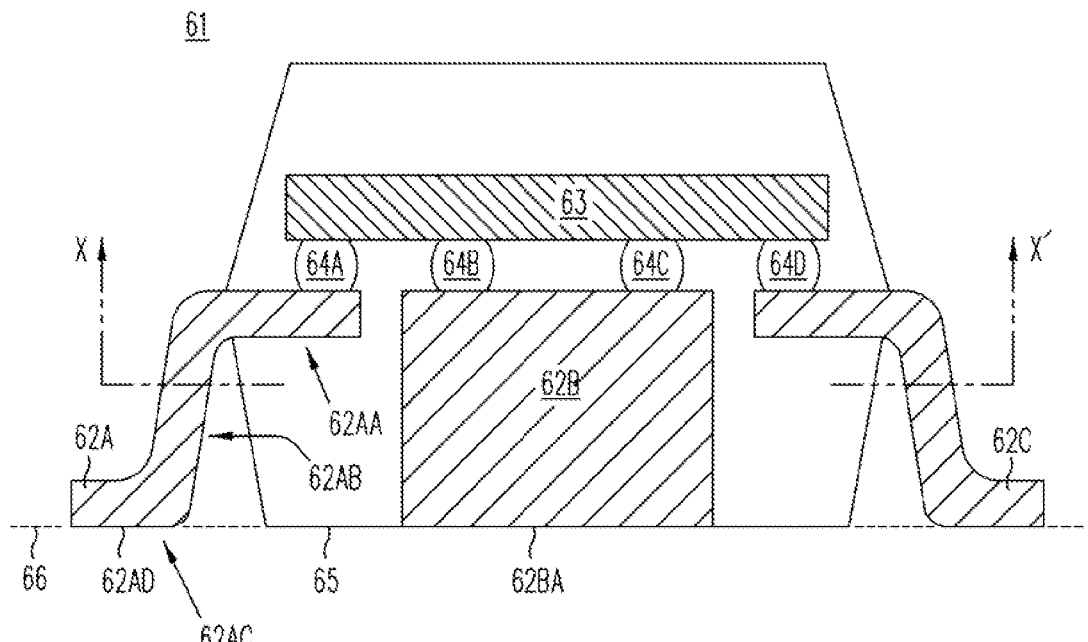
FIG. 4A shows a cross-sectional view of a BOL SOT-like semiconductor package according to the invention.

FIG. 4A shows a cross-sectional view of a BOL SOT-like semiconductor package 61 comprising a semiconductor die 63, leads 62A and 62C, and a heat slug 62B encased in a molding compound 65. As with package 21, shown in FIG. 2A, solder bumps 64A and 64D connect die 63 with leads 62A and 62C, respectively, but unlike package 21, solder bumps 64B and 64C connect die 63 with heat slug 62B. Solder bumps 62A-64D are typically in contact with contact pads (not shown) on die 63 in order to provide adequate electrical and thermal contact and to provide sufficient area to maintain mechanical support during the assembly process. In some embodiments, solder bumps 64B and 64C are identical to solder bumps 64A and 64D.

Leads 62A and 62C have a shape typical of the leads in an SOT package. Thus, lead 62A, for example, includes a horizontal leg 62AA that is encased in molding compound 65 and contacts solder bump 64A, a bent portion 62AB that is outside molding compound 65 and extends downward towards a mounting foot 62AC. A mounting surface 62AD of foot 62AC is attached to a surface 66 of a printed circuit board or other supporting member. Lead 62C has a similar shape.

The bottom surface 62BA of heat slug 62B is exposed at the bottom of molding compound 65 and is also in contact with surface 66. The bottom surface 62BA of heat slug 62B is coplanar with the mounting surface 62AD of lead 62A and the similar mounting surface of lead 62B.

The solder bumps 64B and 64C thus provide a highly-conductive thermal path by which heat generated in die 63 can escape to heat slug 62B and through heat slug 62B to the surface 66 of the printed circuit board or other supporting structure. To facilitate the transfer of heat, the horizontal cross-sectional area of heat slug 62B through cross-section X-X' should be substantially greater (e.g., at least double) sum of the horizontal cross-sectional areas of leads 62A and 62C and the remaining leads (not shown) in package 61 through cross-section X-X'.

Figure 4B:
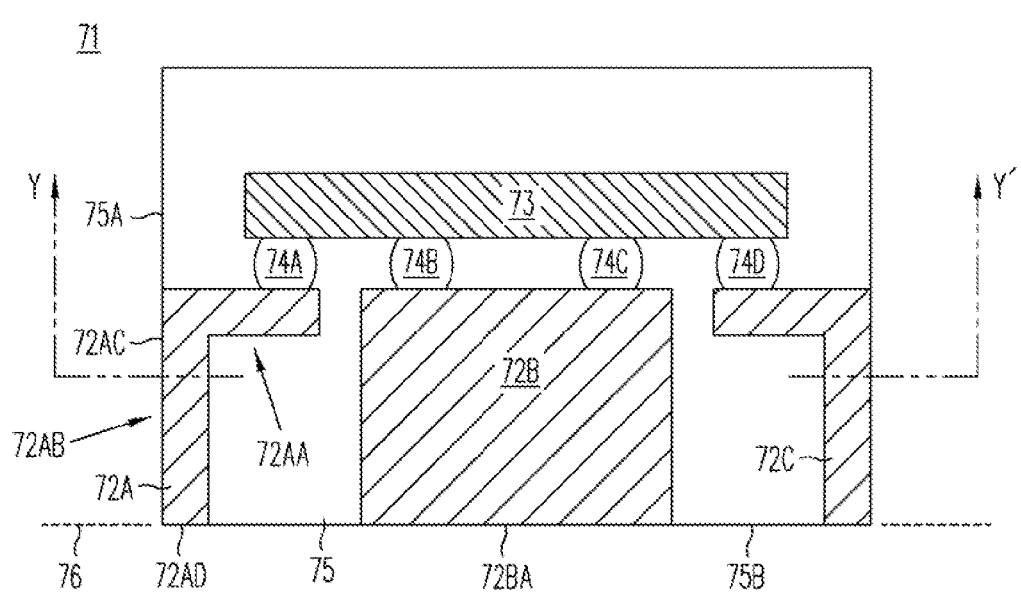
FIG. 4B shows a cross-sectional view of a BOL DFN semiconductor package according to the invention.

FIG. 4B shows a cross-sectional view of a DFN package 71 having a similar heat transfer structure. Package 71 comprises a die 73, leads 72A and 72C, and a heat slug 72B encased in a molding compound 75. Solder bumps 74A and 74D connect die 73 with leads 72A and 72C, respectively, and solder bumps 74B and 74C connect die 73 with heat slug 72B. Solder bumps 72A and 72D are in contact with contact pads (not shown) on die 73. In some embodiments, solder bumps 74B and 74C are identical to solder bumps 74A and 74D.

Leads 72A and 72B have a shape typical of the leads in a DFN package. Thus, lead 72A, for example, includes a horizontal leg 72AA that is encased in molding compound 75 and contacts solder bump 74A and a vertical leg 72AB that extends downward and terminates at a mounting surface 72AD, which is attached to a surface 76 of a printed circuit board or other supporting member. Mounting surface 72AD is flush with a bottom surface 75B of molding compound 75 and a side surface 72AC of lead 72 is flush with a side surface 75A of molding compound 75. Lead 72C has a similar shape.

The bottom surface 72BA of heat slug 72B is exposed at the bottom of molding compound 75 and is also in contact with surface 76. The bottom surface 72BA of heat slug 72B is coplanar with the mounting surface 72AD of lead 72A and the similar mounting surface of lead 72C.

The solder bumps 74B and 74C thus provide a highly-conductive thermal path by which heat generated in die 73 can escape to heat slug 72B and through heat slug 72B to the surface 76 of the printed circuit board or other supporting structure. To facilitate the transfer of heat, the horizontal cross-sectional area of heat slug 72B through cross-section Y-Y' should be substantially greater than (e.g., at least double) the sum of the horizontal cross-sectional areas of leads 72A and 72C and the remaining leads (not shown) in package 71 through cross-section Y-Y'.

Figure 5:
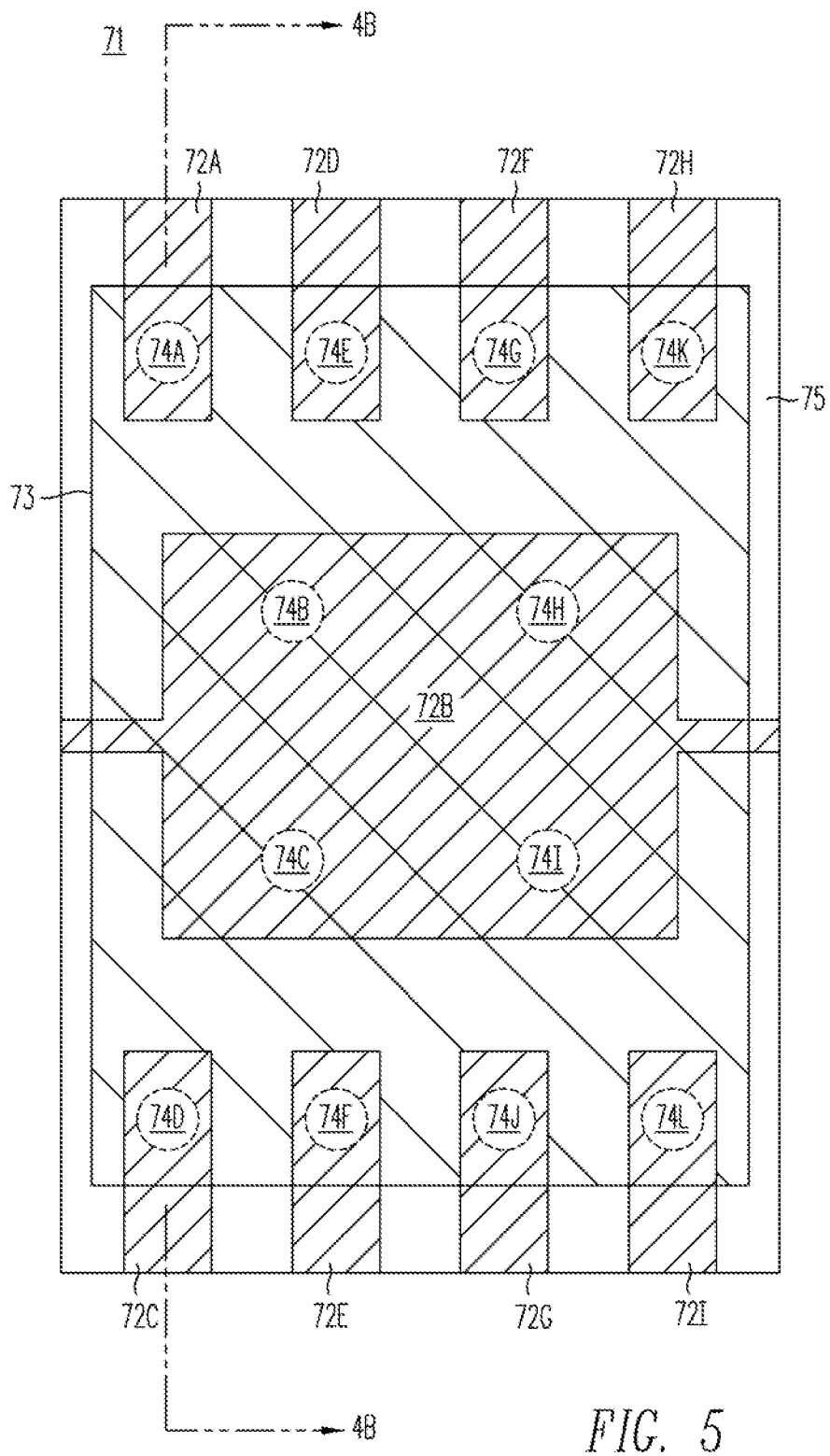
FIG. 5 shows a plan view of the package of FIG. 4B.

FIG. 5. shows a plan view of DFN package 71 shown in FIG. 4B, which is taken at cross-section 4B-4B in FIG. 5. DFN package 71 includes leads 72A, 72D, 72F and 72H along one side and leads 72C, 72E, 72G and 72I along the opposite side. Die 73 is connected to leads 72A, 72D, 72F and 72H by solder bumps 74A, 74E, 74G and 74K, respectively; die 73 is connected to leads 72C, 72E, 72G and 72I by solder bumps 74D, 74F, 74J and 74L, respectively. Die 73 is connected to heat slug 72B by solder bumps 74H and 74I as well as solder bumps 74B and 74C shown in FIG. 4B.

Figure 6:
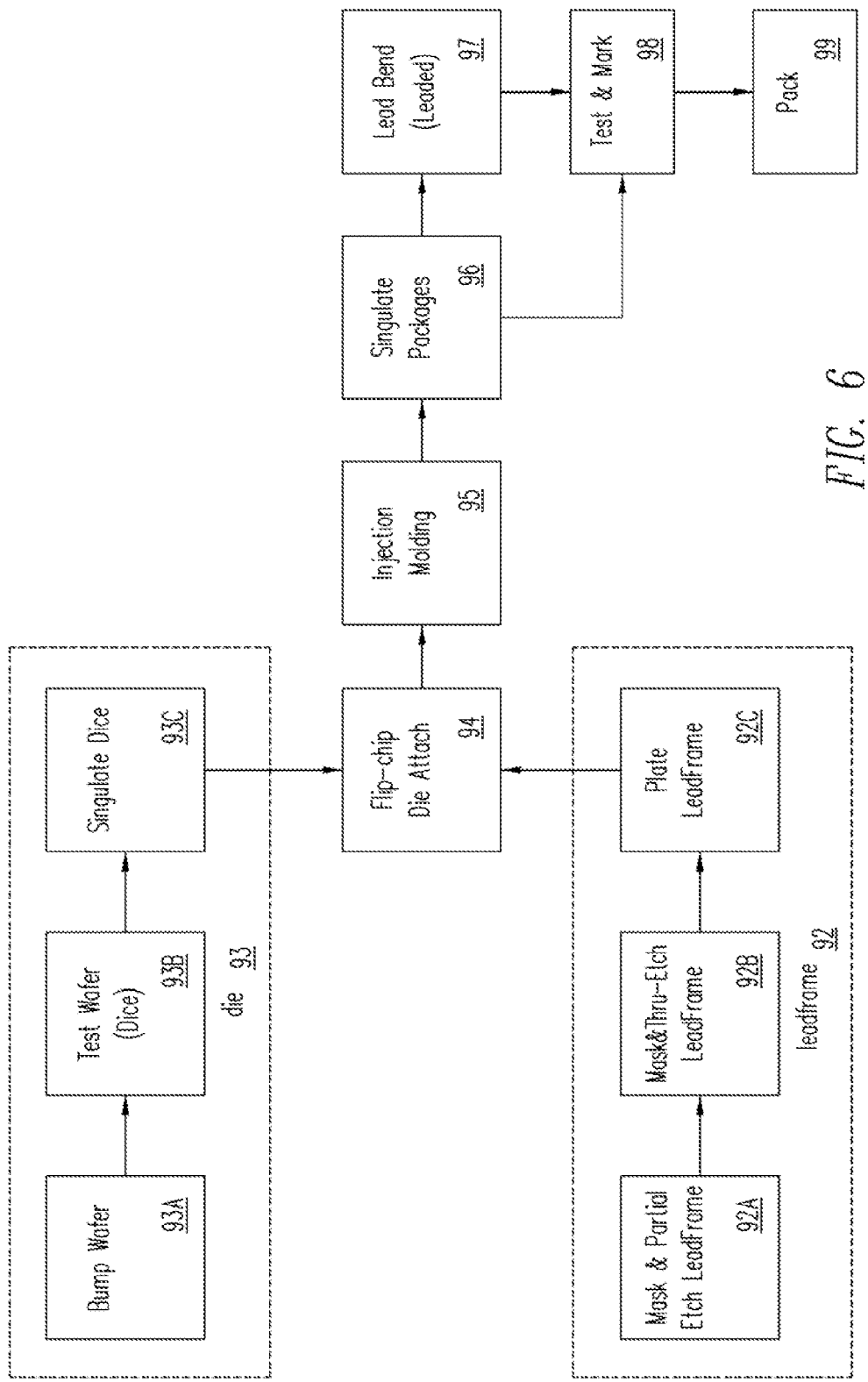
FIG. 6 is a flow chart of a process for fabricating a semiconductor package according to the invention.

FIG. 6 is a flow chart of a process for fabricating a semiconductor package according to the invention. Box 92 represents the steps of fabricating the leadframe, including masking and partially etching the leadframe (box 92A), masking and through-etching the leadframe (box 92B), and plating the leadframe (box 92C). These steps may be performed by conventional processes, except that heat slugs are formed in the partial- and through-etch steps. Box 93 represents the steps of fabricating the die, including forming the solder bumps on the wafer (box 93A), testing the dice on the wafer (box 93B), and singulating the dice (box 93C). These steps may be performed in a conventional way, although solder bumps will be formed at locations on the dice where they will contact the heat slugs.

After the dice and leadframes have been fabricated, the dice are attached to the leadframes by conventional "flip-chip" processes (box 94). The dice and leadframes are then encased in molding compound by an injection molding process (box 95). The individual packages are singulated by sawing (box 96). If the packages are to be SOT-like packages, the leads that protrude from the molding compound are bent into the shape shown in FIG. 4A, for example (box 97). Finally, the packages are tested and marked (box 98) and packed in shipping containers (box 99).

Figure 7A:
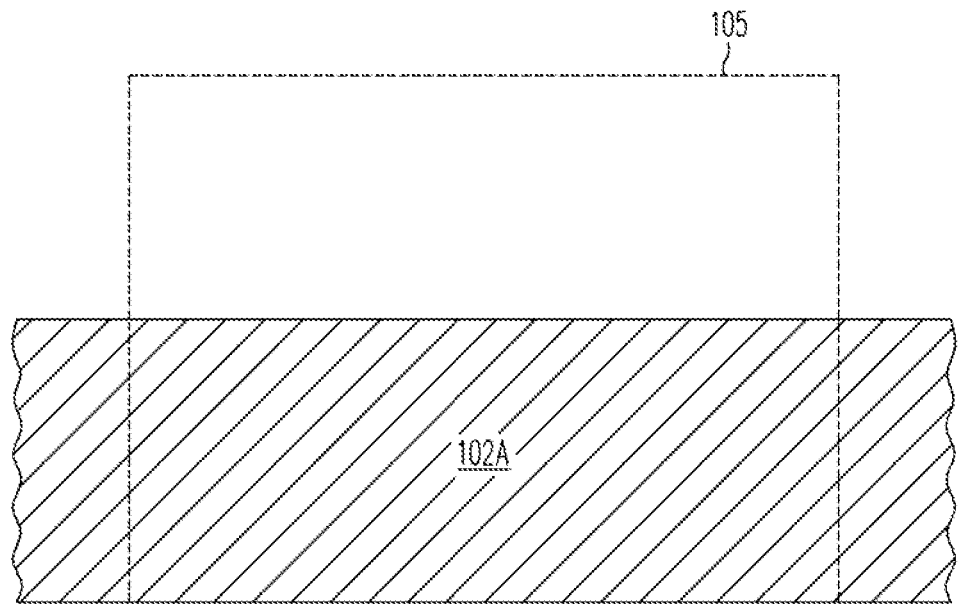
FIGS. 7A-7E show cross-sectional views of the package at several stages of the fabrication process.

FIGS. 7A-7E are cross-sectional views of the structure during the leadframe fabrication stage (box 92) and die-attach stage (box 94). The process begins with a metal sheet 102A, which is typically a copper sheet with a thickness in the range of 0.2 mm to 0.4 mm. It will be understood that a two-dimensional array of numerous leadframes are formed simultaneously from a single metal sheet. FIG. 7A shows a portion of metal sheet 102A where a package 105 will be formed.

Figure 7B:
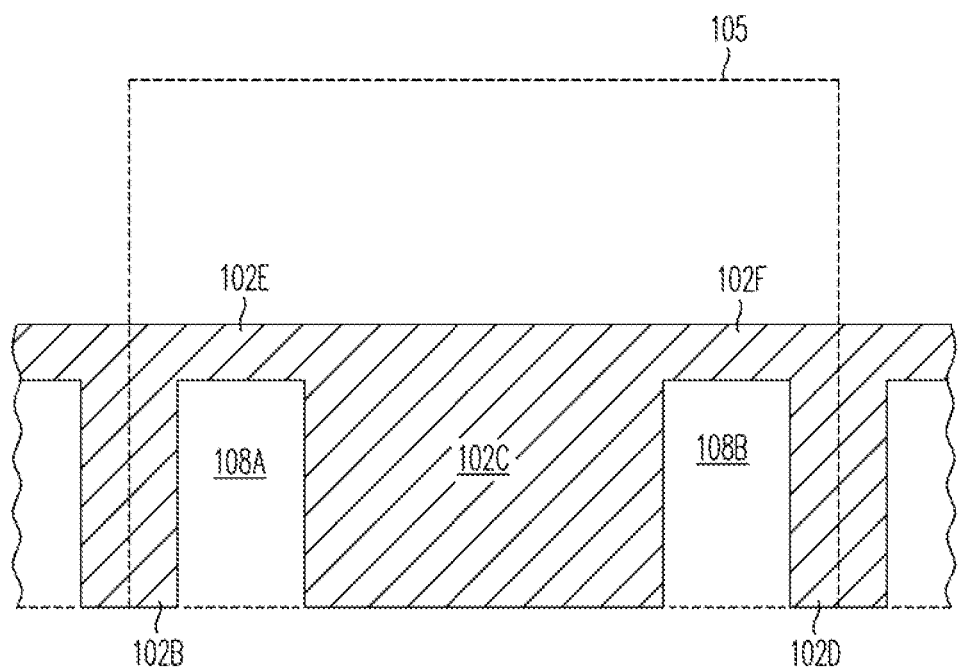

Metal sheet 102A is masked and partially etched to form projections that will become leads 102B and 102D and heat slue 102C (FIG. 7B). Because this is a partial etch, lead 102B remains connected to heat slug 102C by a bridge 102E, and lead 102D remains connected to heat slug 102C by a bridge 102F. A cavity 108A is formed between lead 102B and heat slug 102C, and a cavity 108B is formed between lead 102D and heat slug 102C.

Figure 7C:
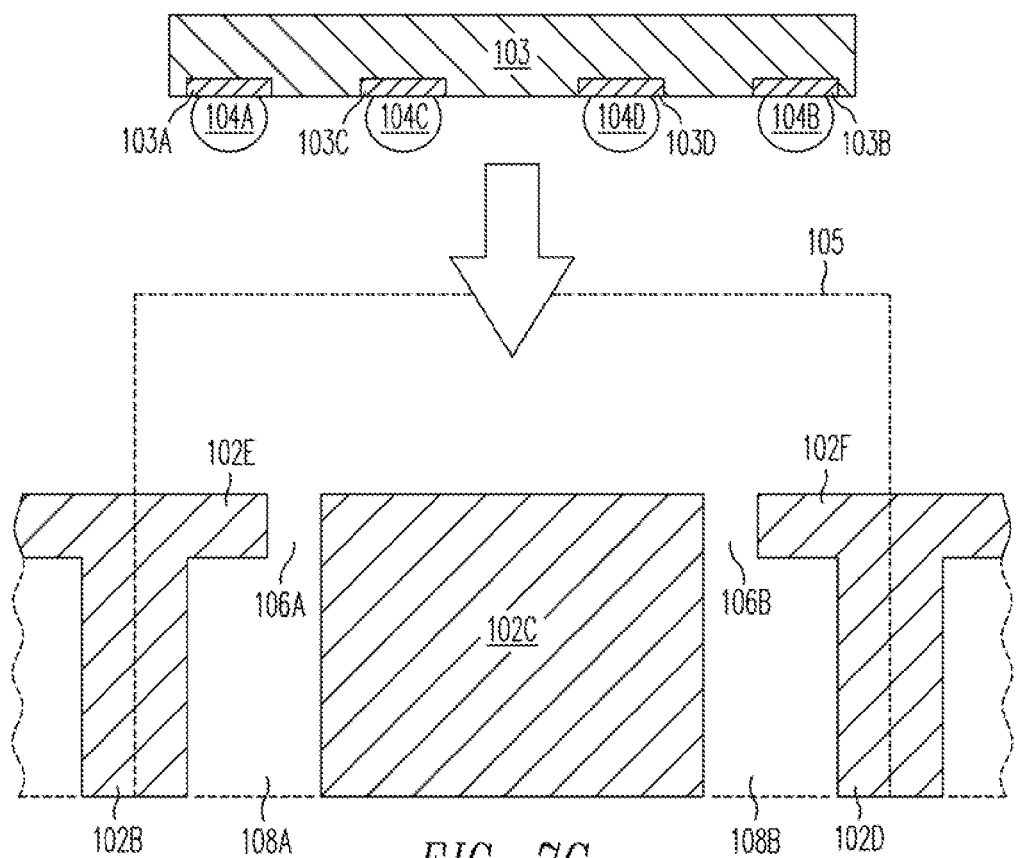

Metal sheet 102A is masked again and etched completely through at locations in bridges 102E and 102F, forming a gap 106A between lead 102B and heat slug 102C and a gap 106B between lead 102D and heat slug 102C (FIG. 7C). A remaining portion of bridge 102E becomes a part of lead 102B, and a remaining portion of bridge 102F becomes a part of lead 102D. It will be understood that the etch-through mask is patterned such that leads 102B and 102D remain attached to heat slug 102C by means of tie bars outside the plane of the drawing.

Figure 7D:
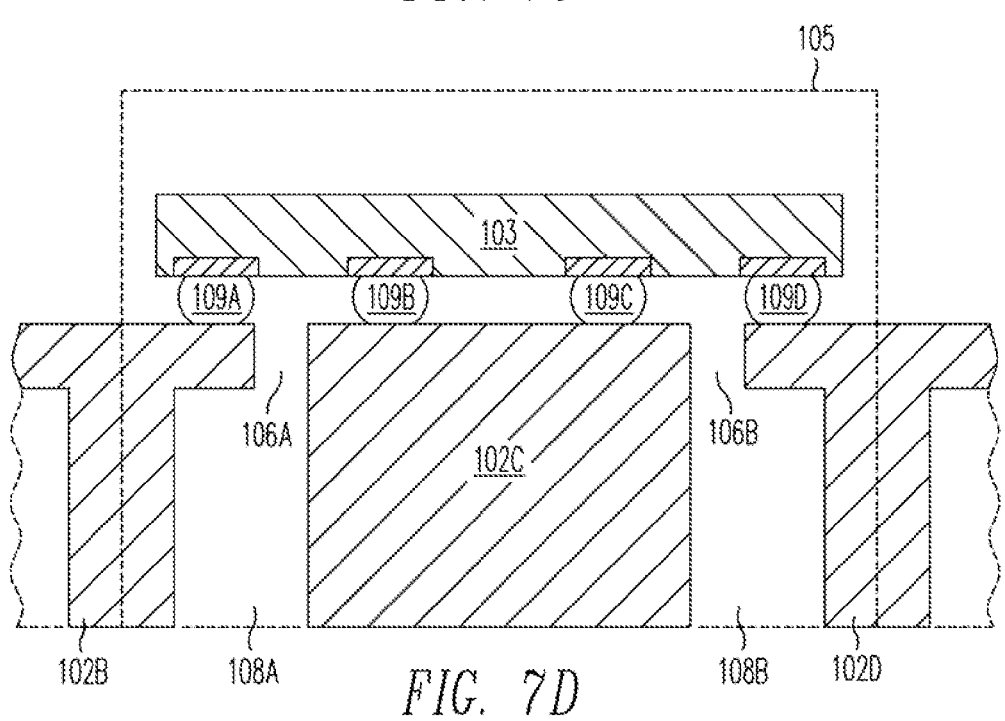

A die 103 has solder balls 104A-104D formed in the normal manner. Solder balls 104A-104D are attached to contact pads 103A-103D, respectively, on die 103. Die 103 is advanced towards leads such that solder balls 104A and 104B are brought into contact with leads 102B and 102D, respectively, and solder balls 104C and 104D are brought into contact with heat slug 102C (FIG. 7D). Leads 102 B and 102D and heat slug 102C are heated to reflow the solder, causing solder balls 104A-104D to partially melt and become attached to contact pads become solder bumps 104A-104D. When the solder has cooled, solder balls 104A-104D have become solder bumps 109A-109D, respectively.

Figure 7E:
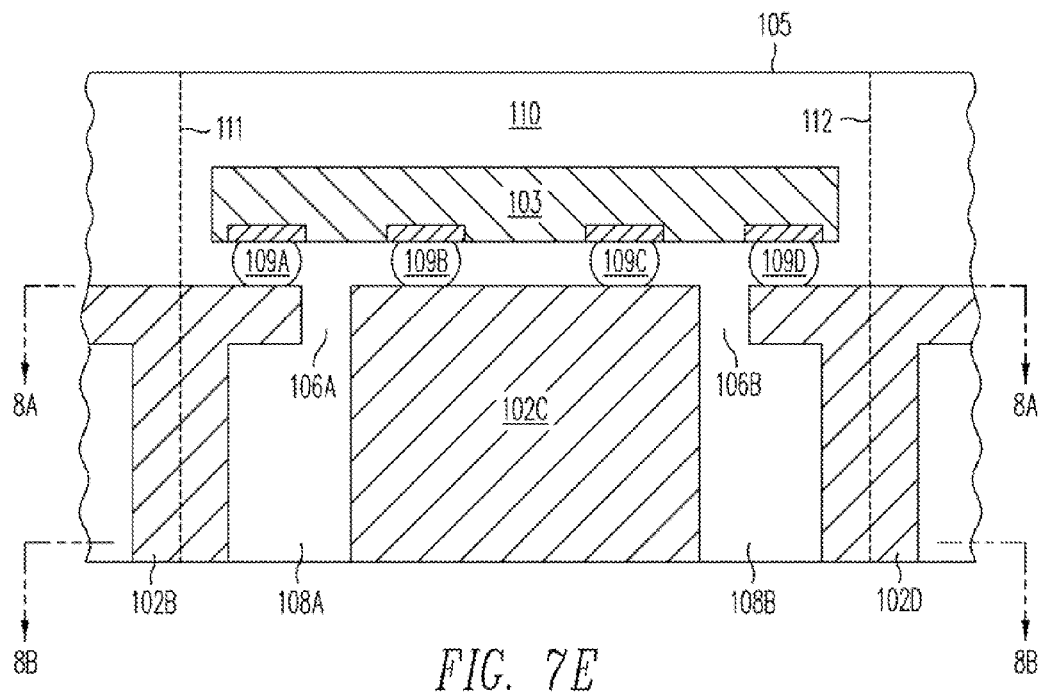

As shown in FIG. 7E, Die 103, leads 102B and 102D, and heat slug 102C are encapsulated by injection molding in a plastic molding compound 110. The individual packages are then singulated by sawing along lines 111 and 112 and similar perpendicular lines, thereby forming package 105.

FIG. 8A is a view of package 105 taken at the horizontal cross-section 8A-8A shown in FIG. 7E, and FIG. 8B is a view of package 105 taken at the horizontal cross-section 8B-8B shown in FIG. 7E. Leads 102B, 102A, 102F and 102G are aligned in a row along one side of package 105; leads 102D, 102E, 102H and 102I are aligned in a row along one side of package 105. The remains of tie bars 102J and 102K that were severed in the singulation process (FIG. 7E) are also shown in FIG. 8A. FIG. 8B illustrates that the horizontal cross-sectional area of heat slug 102C is substantially greater (at least double) than the sum of the horizontal cross-sectional areas of leads 102A, 102B and 102D-102I. Consequently, the heat transfer path represented by heat slug 102C has far less thermal resistance than the corresponding heat transfer paths through leads 102A, 102B and 102D-102I.

As stated above, the solder balls (also, by convention, described as bumps or pillars) are normally attached to metal contact pads on the surface of the semiconductor die. In a conventional die, these contact pads serve as points of connection between external circuitry and circuitry and devices inside the die. To make the connections between the contact pads and the internal circuitry and devices, a stack of metal layers is normally formed on the surface of the die. The metal layers are patterned into circuit paths and are separated by interlayer dielectric layers. A dielectric layer separates the lowest metal layer from the substrate, dielectric layers separate one metal interconnection layer from another, and a dielectric "passivation" layer typically covers and protects the top metal layer, sealing and encapsulating the entire multilayer stack. Connections between the metal layers and the surface of the semiconductor substrate and between the metal layers themselves are made by vias that extend through the dielectric layers and are filled with metal or another conductive material.

The dielectric layers, which may for example comprise silicon dioxide, doped silicon glass, spin-on glass, silicon-nitride, or polyimide, are typically not good thermal conductors. Phenomenologically, poor electrical conductors are generally poor thermal conductors because amorphous and non-crystalline materials do not easily transport charge or heat throughout their non-uniform atomic structure. As a result, the electrically insulating material surrounding interconnecting metal layers that form electrical circuitry in a semiconductor microchip unavoidably inhibit the conduction of heat. Thus the metal/dielectric layer stack represents a thermal barrier that may prevent the heat generated within the semiconductor substrate from being easily transferred to the metal contact pads.

Figure 9A:
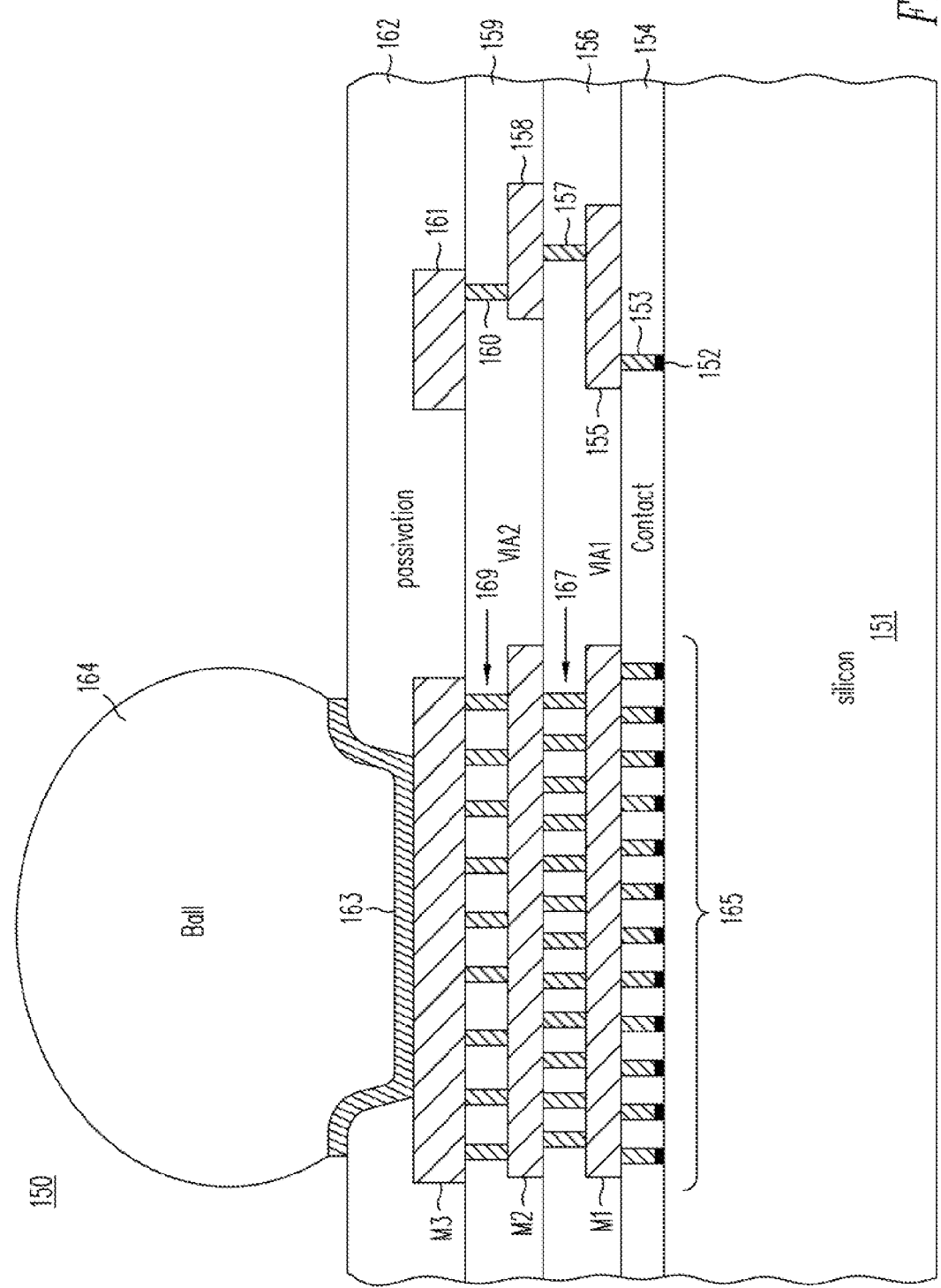
FIG. 9A shows a cross-sectional view of an IC die containing a stack of interlayer dielectric layers and metal layers and thermal vias connecting the metal layers.

This problem is addressed by the structure shown in FIG. 9A. An integrated circuit die 150 comprises a semiconductor substrate 151 (in this embodiment comprising silicon), a stack of dielectric layers comprising a contact layer 154, which adjoins substrate 151, interlayer dielectric layers 156 and 159 and a passivation layer 162, and a stack of metal layers M1, M2 and M3, which may be made of aluminum, M3 being a top metal layer. Interlayer dielectric layers 156 and 159, which are located between contact layer 154 and passivation layer 162, are sometimes referred to as the VIA 1 and VIA 2 layers, respectively. A principal surface of die 150 comprises an exposed surface of passivation layer 162.

As shown, metal layer M1 is located at an upper surface of contact layer 154; metal layer M2 is located at the interface between interlayer dielectric layer 159 and the underlying interlayer dielectric layer 156; and metal layer M3 is located at a lower surface of passivation layer 162.

Also shown are electrical circuit paths 155, 158 and 161, which are extensions of metal layers M1, M2 and M3, respectively. Circuit path 155 is connected to the surface of substrate 151 by a metal-filled via 153, circuit path 158 is connected to circuit path 155 by a metal-filled via 157, and circuit path 161 is connected to circuit path 158 by a metal-filled via 160. The metal in via 153 includes a barrier layer 152 (e.g., titanium tungsten or a silicide) to prevent the metal ions from migrating into the semiconductor substrate 151.

A solder ball 164 is attached to an under bump metal (UBM) layer 163, which in turn is in contact with metal layer M3. This section of metal layer M3 thus serves as a contact pad for die 150 and provides mechanical support for solder ball 164.

To facilitate thermal conduction between substrate 151 and solder ball 164, sections of metal layers M1, M2 and M3 are arranged in a vertical stack under solder ball 164, and a two-dimensional array 165 of thermal vias extend through contact layer 154 from substrate 151 to metal layer M1. Likewise, a two-dimensional array 167 of thermal vias extend through VIA 1 layer 156 from metal layer M1 to metal layer M2; and a two-dimensional array 167 of thermal vias extend through VIA 2 layer 159 from metal layer M2 to metal layer M3.

Each of the thermal vias in arrays 165, 167 and 169 is filled with a metal or other highly thermally conductive material, such as aluminum, copper, silver, tungsten, platinum or other metals. The array may comprise a rectilinear pattern with the thermal vias being 0.3 μm to 5 μm wide and the vias in each row and column of the pattern being separated by 0.3 μm to 5 μm. Ideally each via should be as large and closely spaced as possible, but in many cases photolithographic and planarization limitations in manufacturing will restrict the via design rules to be consistent with those used elsewhere in the die, e.g. 0.35 μm opening in a 0.35 μm process. In such case lower thermal resistance can be achieved by packing more vias into the same area, possibly by aggressively pushing the minimum via to via spacing limit to the smallest possible dimension, e.g. 0.35-μm to 0.2-μm spacing in a 0.35 μm process. Each array may include from tens to hundreds of vias Preferably, the sum of the cross sectional areas of the vias is substantial, at least 10% of the die pad area and ideally over 40% of the die pad area.

Since metal layer M3 is in direct contact with UBM layer 163, the thermal via arrays 165, 167 and 169 provide a low-resistance path for heat to escape from substrate 151 to solder ball 164.

From a processing standpoint, metal layers M1, M2 and M3 can be patterned simultaneously with layers 155, 158 and 161, and the thermal vias in arrays 165, 167 and 169 can be etched at the same time as vias 153, 157 and 160. Thus no additional processing steps are required.

FIG. 9B shows a detailed view of a portion of the thermal via arrays and metal layers shown in FIG. 9A.

FIGS. 9C-9G illustrate equivalent thermal resistance paths for the thermal via arrays and metal layers shown in FIG. 9A. In FIG. 9C, the thermal resistances are shown as separate paths extending through each of the thermal vias: 172A represents the thermal resistance $R_{enter}$ of each of the thermal vias in contact layer 154; 172B represents the thermal resistance $R_{M1}$ of metal layer M1; 172C represents the thermal resistance $R_{VIA1}$ of each of the thermal vias in interlayer dielectric layer 156; 172D represents the thermal resistance $R_{M2}$ of metal layer M2; 172E represents the thermal resistance $R_{VIA2}$ of each of the thermal vias in interlayer dielectric layer 159; 172F represents the thermal resistance $R_{M3}$ of metal layer M3; 172G represents the thermal resistance $R_{UBM}$ of UBM layer 163; and 172H represents the thermal resistance $R_{ball}$ of solder ball 164.

In FIG. 9D, the thermal paths are simplified by lumping together the thermal resistances of each of metal layers M1-M3, UBM layer 163 and solder ball 164. In FIG. 9E, the thermal paths are further simplified by lumping together the thermal resistances of metal layers M1-M3, UBM layer 163 and solder ball 164 into a single thermal resistance 175 equal to $R_{metal}$. In FIG. 9F, the thermal paths are further simplified by lumping together the thermal resistances of the thermal vias in each of contact layer 154 and interlayer dielectric layers 156 and 159 into $R_{enter}$, $R_{VIA1}$ and $R_{VIA2}$, respectively. In FIG. 9F, the thermal paths are further simplified by lumping together the thermal resistances of the thermal vias in contact layer 154 and interlayer dielectric layers 156 and 159 into a single thermal resistance 178 equal to $R_{enter}+R_{VIA1}+R_{VIA2}$.

FIG. 9H is a graph showing the thermal resistance through a single interlayer dielectric layer ($R_0$) as a function of the percentage of the total area occupied by the thermal via array. As shown, $R_\Theta$ decreases from $R_0(max)$ when the percentage is 0% (no thermal vias) to $R_0(min)$ when the percentage is 100% (a single large thermal via). Since Newton's Law of Cooling is a single order differential equation, we can approximate the area dependence of thermal resistance by an exponential curve where the reduction in thermal resistance is greatest at small total via areas and diminishes for increasingly larger thermal vias. Therefore, a total via area equal to 10% of the die pad area shows a marked improvement, a 30% via area exhibits a significant reduction in thermal resistance, and increases above 70% show diminishing benefits.

In some situations it is necessary for the array of thermal vias to make contact with the semiconductor substrate at a location that is not directly below the solder ball, i.e., the area of contact between the array and the substrate is horizontally offset from the location of the solder ball. Such a situation is illustrated in FIG. 10A, wherein the area of contact 190 with the substrate 151 is horizontally offset from the location of solder ball 164. To solve this problem, the metal layers M1, M2 and M3 are extended laterally so that metal layers M1, M2 and M3 extend both above the area of contact 190 and below solder ball 164. An array 192 of thermal vias extends through contact layer 154 to metal layer M1. Thermal via arrays 193 and 194 are located directly above array 190 and establish thermal conduction paths between metal layers M1 and M2 and metal layers M2 and M3, respectively. Thermal via arrays 195 and 196 are located directly below solder ball 164 and establish thermal conduction paths between metal layers M1 and M2 and metal layers M2 and M3, respectively. The distance L represents the horizontal distance between the right edge of arrays 192-194 and the left edge of arrays 195 and 196.

In other embodiments, it may be possible to extend only one of the metal layers M1, M2 and M3 both above the area of contact 190 and below solder ball 164, thereby eliminating the need for some of the thermal via arrays. For example, metal layer M1 could be located only above the area of contact 190 and metal layer M3 could be located below solder ball 164. This would allow the thermal via arrays 194 and 195 to be eliminated.

Figure 10H:
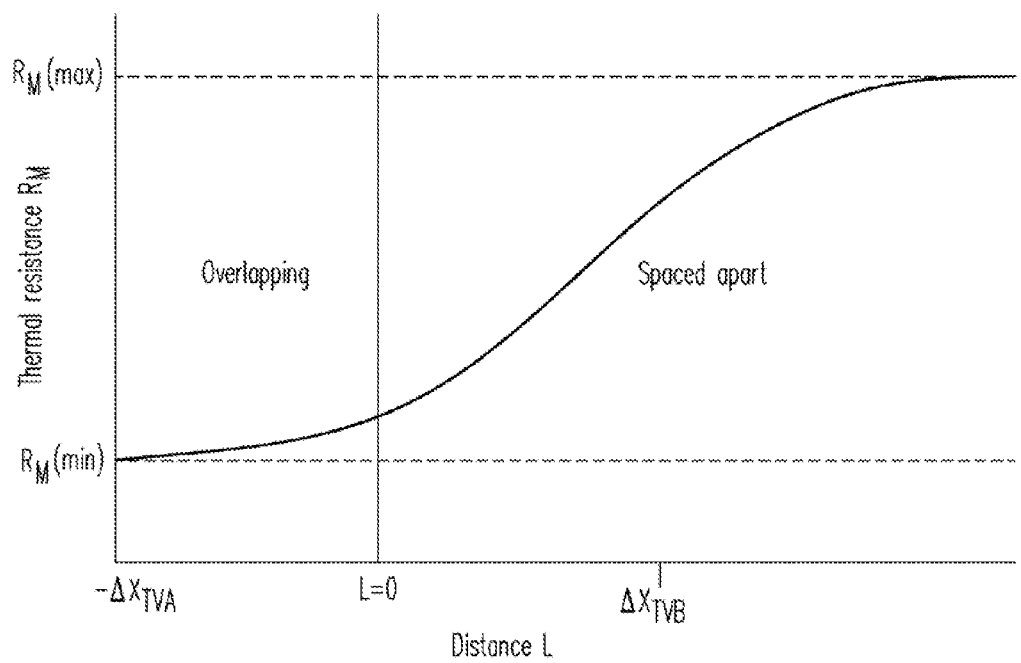
FIG. 10H is a graph showing the total thermal resistance of the structure of FIG. 10A as a function of horizontal offset between the two stacks of thermal vias.
Figure 10A:
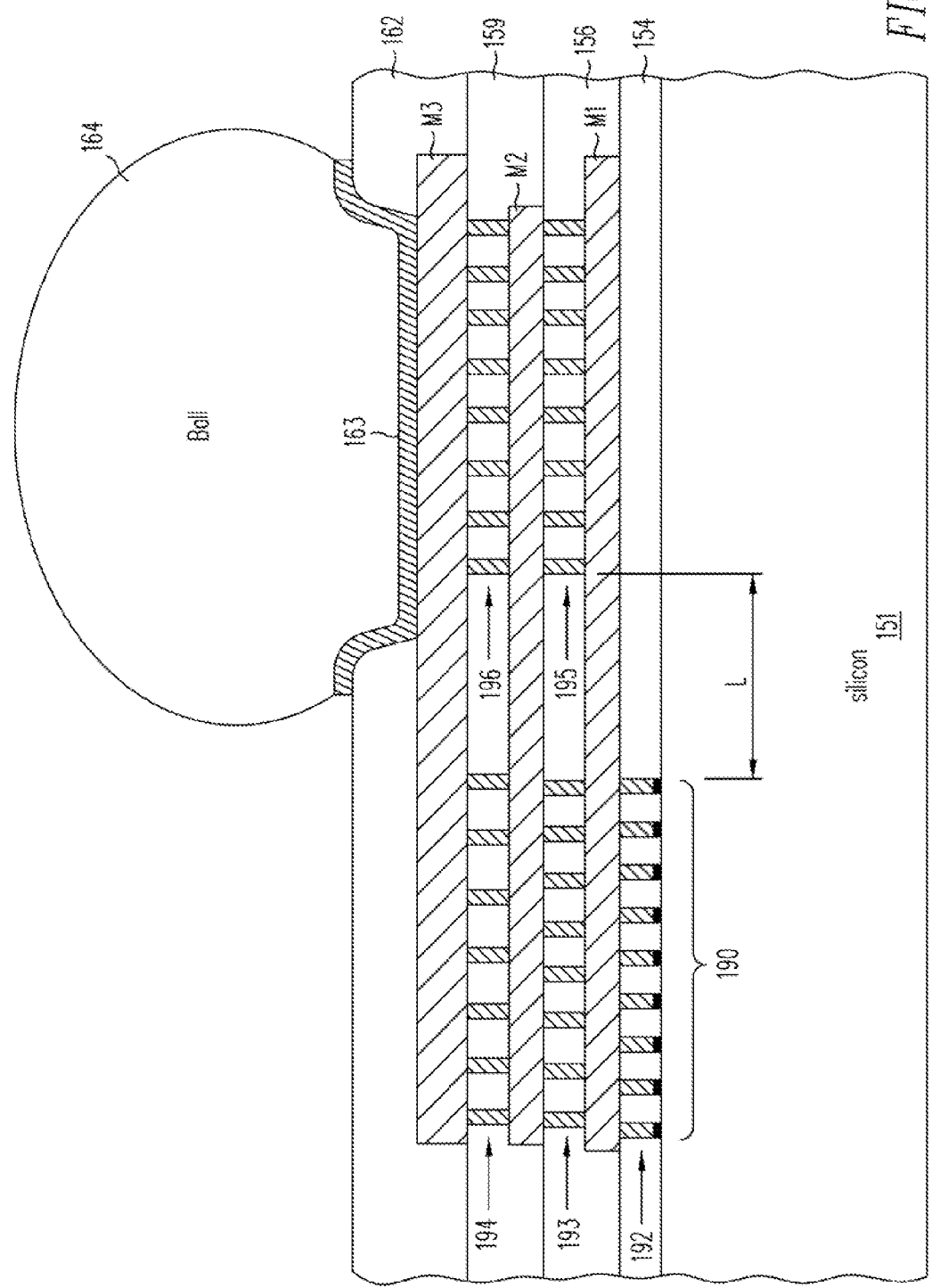
FIG. 10A shows a cross-sectional view of an IC die containing a stack of interlayer dielectric layers and metal layers and two stacks of thermal vias connecting the metal layers, wherein the metal bump is horizontally offset from the area of contact between the thermal vias and the semiconductor substrate.
Figure 10D:
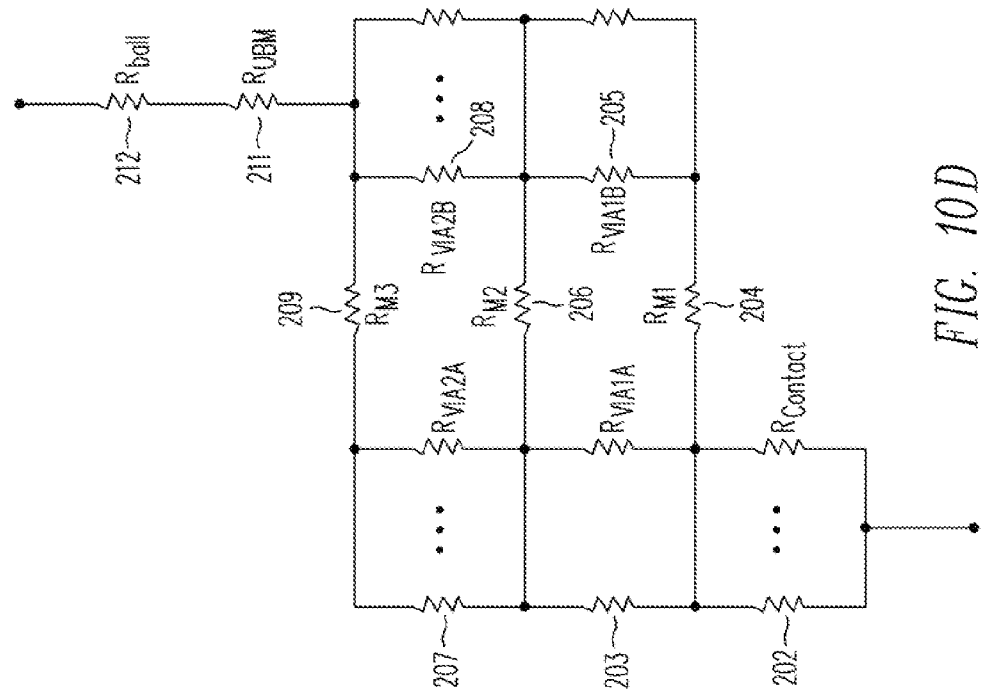
Figure 10B:
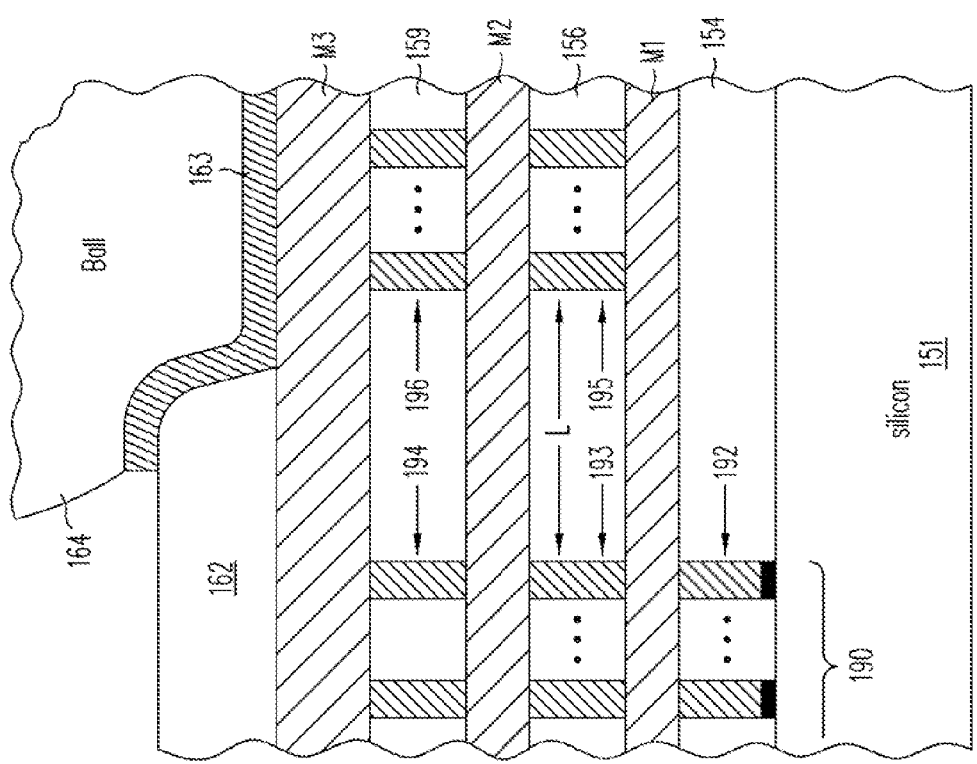
FIG. 10B is a detailed cross-sectional view of a portion of the structure shown in FIG. 10A.

FIG. 10B is a detailed view of the structure shown in FIG. 10A.

Figure 10C:
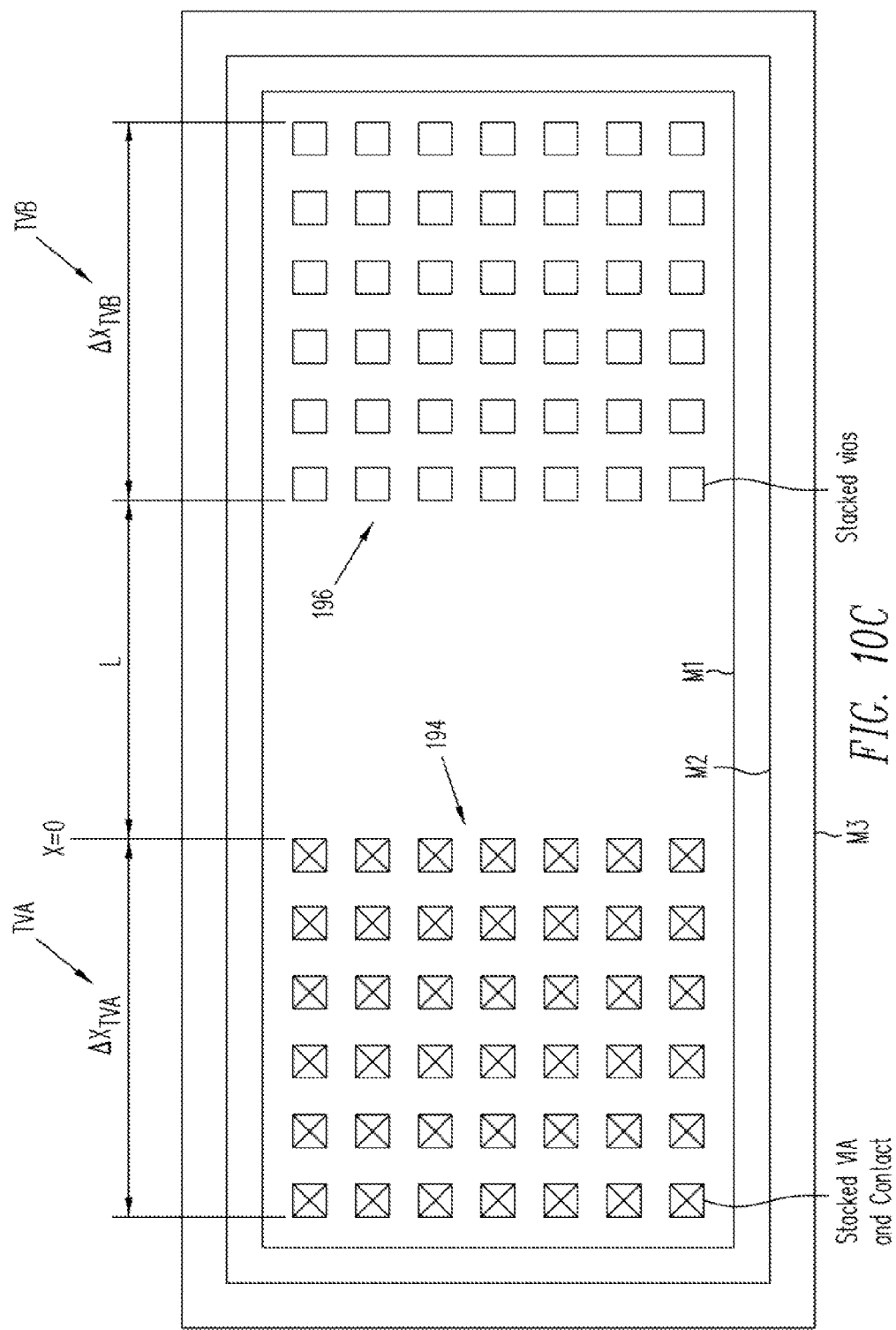
FIG. 10C is a plan view of the structure shown in FIG. 10A showing the size of the horizontal offset between the two stacks of thermal vias.

FIG. 10C is a plan view of the two columns of thermal vias 192-194 and 195-196 from above, labeled TVA and TVB, respectively. The width of column TVA is $\Delta X_{TVA}$ and the width of column TVB is labeled $\Delta X_{TVB}$.

FIGS. 10D-10G illustrate equivalent thermal resistance paths for the thermal via arrays and metal layers shown in FIG. 10A. In FIG. 10D, the thermal resistances are shown as separate paths extending through each of the thermal vias: 202 represents the thermal resistance $R_{enter}$ of each of the thermal vias in contact layer 154; 204 represents the thermal resistance $R_{M1}$ of metal layer M1; 203 represents the thermal resistance $R_{VIA1A}$ of each of the thermal vias in column TVA through interlayer dielectric layer 156; 205 represents the thermal resistance $R_{VIA1B}$ of each of the thermal vias in column TVB through interlayer dielectric layer 156; 206 represents the thermal resistance $R_{M2}$ of metal layer M2; 207 represents the thermal resistance $R_{VIA2A}$ of each of the thermal vias in column TVA through interlayer dielectric layer 159; 208 represents the thermal resistance $R_{VIA2B}$ of each of the thermal vias in column TVB through interlayer dielectric layer 159; 209 represents the thermal resistance $R_{M3}$ of metal layer M3; 211 represents the thermal resistance $R_{UBM}$ of UBM layer 163; and 212 represents the thermal resistance $R_{ball}$ of solder ball 164.

In FIG. 10E, the thermal paths are simplified by lumping together the thermal resistances of each thermal via array. The combined resistance of the thermal vias in array 192 is denoted as $R^*_{enter}$; the combined resistance of the thermal vias in array 193 is denoted as $R^*_{VIA1A}$; the combined resistance of the thermal vias in array 194 is denoted as $R^*_{VIA2A}$; the combined resistance of the thermal vias in array 195 is denoted as $R^*_{VIA1B}$; and the combined resistance of the thermal vias in array 196 is denoted as $R^*_{VIA2B}$; The combined resistance of UBM layer 163 and solder ball 164 is denoted as $R_{ball}+R_{UBM}$. In FIG. 10F, the thermal paths are further simplified by lumping together the thermal resistances in each of the three parallel thermal circuit paths from contact layer 154 to UBM layer 163 as $R_{M1}+R^*_{VIA1B}+R^*_{VIA2B}$, $R_{M2}+R^*_{VIA1A}+R^*_{VIA2B}$, and $R_{M3}+R^*_{VIA1A}+R^*_{VIA2A}$, respectively. In FIG. 10G, the thermal paths are further simplified by lumping together the thermal resistances of the metal layers M1, M2 and M3 and interlayer dielectric layers 156 and 159 into a single thermal resistance $R_M$. As indicated, the value of $R_M$ is much greater than the value of either $R_{ball}+R_{UBM}$ or $R_{enter}$.

FIG. 10H is a graph showing the thermal resistance $R_M$ as a function of L, shown in FIG. 10A. As shown, $R_M$ increases from $R_M$(min) when $L=-\Delta X_{TVA}$, where the left edges of the thermal via array columns TVA and TVB are vertically aligned, to $R_M$(max), where the thermal via array columns TVA and TVB are spaced apart. This graph means that in cases where the thermal vias are not placed directly under the pad, the length of the intervening metal from the silicon heat source to the pad is the dominant variable. When the length of this metal exceeds $L=+\Delta X_{TVB}$, the benefit of thermal vias is substantially reduced. As described in Williams et al., "Electrothermal Circuit Simulation of Power ICs Combining SPICE and 3D Finite Element Analysis," Proceedings of the 4th International Symposium on Power Semiconductor Devices and ICs (ISPSD '92) 1992, p.p. 282-287, the most significant drop in temperature occurs within one-sigma, or the first 30 μm adjacent to a dominant heat source, meaning that to obtain a substantial benefit from thermal vias, the intervening metal length L should not exceed 60 μm from a dominant heat source to the pad, and ideally should not exceed 30 μm in length.

The above description is intended to be illustrative and not limiting. Many alternative embodiments of this invention will be apparent to persons of skill in the art. The broad principles of this invention are defined only in the following claims.

We claim:

1. An integrated circuit die comprising:
   a semiconductor substrate;
   a stack of dielectric layers formed on a surface of said semiconductor substrate, said stack including a contact layer, at least one interlayer dielectric layer, and a passivation layer, said contact layer adjoining said semiconductor substrate, a principal surface of said die having an exposed surface of said passivation layer, said at least one interlayer dielectric layer being sandwiched between said contact layer and said passivation layer;
   a stack of metal layers, each of said metal layers being at an interface between two of said dielectric layers, a first metal layer being located at an upper surface of said contact layer, a top metal layer being located at a lower surface of said passivation layer;
   a plurality of thermal vias, each of said thermal vias being filled with metal, said thermal vias being grouped in two-dimensional arrays, said thermal vias including a first array of thermal vias contacting said surface of said semiconductor substrate, terminating at said surface of said semiconductor substrate, and extending from said semiconductor substrate through said contact layer to said first metal layer, and a second array of thermal vias extending from said top metal layer through one of said at least one interlayer dielectric layers adjoining said passivation layer;
   an under bump metal (UBM) layer located at said principal surface of said die and contacting the top metal layer; and
   a first metal bump attached to said UBM layer, a thermal path being formed from said semiconductor substrate through said thermal vias and said metal layers to said first metal bump, an area of contact between said first array of thermal vias and said surface of said semiconductor substrate being horizontally offset from a location of said first metal bump, said first array of thermal vias contacting said surface of said semiconductor substrate over an area that is not directly beneath the first metal bump, each of said metal layers extending both directly above said area of contact between said first array of thermal vias and said surface of said semiconductor substrate and directly below said first metal bump.

2. The integrated circuit die of claim 1 wherein said UBM layer is in contact with said top metal layer.

3. The integrated circuit die of claim 1 further comprising a plurality of interlayer dielectric layers, an array of said thermal vias being formed in each of said interlayer dielectric layers, each of said arrays extending between a metal layer located at an interface below one of said plurality of interlayer dielectric layers and a metal layer located at an interface above one of said plurality of interlayer dielectric layers.

4. The integrated circuit die of claim 3 wherein some of said arrays of thermal vias are arranged in at least two columns, said columns being horizontally offset with respect to each other.

5. A semiconductor package comprising the integrated circuit die of claim 1.

6. The semiconductor package of claim 5 wherein said UBM layer is in contact with said top metal layer.

7. The semiconductor package of claim 5 further comprising a plurality of interlayer dielectric layers, an array of said thermal vias being formed in each of said interlayer dielectric layers, each of said arrays extending between a metal layer located at an interface below one of said plurality of interlayer dielectric layers and a metal layer located at an interface above said one of said plurality of interlayer dielectric layers.

8. The semiconductor package of claim 7 wherein some of said arrays of thermal vias are arranged in at least two columns, said columns being horizontally offset with respect to each other.

9. The semiconductor package of claim 5 further comprising a heat slug, said first metal bump connecting said integrated circuit package and said heat slug.

10. The semiconductor package of claim 9 wherein said principal surface of said integrated circuit die includes a peripheral area and a central area, a contact pad being located in said peripheral area.

11. The semiconductor package of claim 10 wherein said die is oriented in said semiconductor package with said principal surface facing downward.

12. The semiconductor package of claim 11 further comprising an electrical lead, a second metal bump connecting said contact pad and said electrical lead.

13. The semiconductor package of claim 12 wherein said integrated circuit die is encased in a molding compound, said molding compound encasing at least a portion of said electrical lead and at least a portion of said heat slug.

14. The semiconductor package of claim 13 where a mounting surface of said electrical lead is coplanar with an exposed bottom of said heat slug.

15. The semiconductor package of claim 14 wherein said electrical lead extends from a lateral surface of said molding compound, said electrical lead including a bent section extending downward to a mounting section, a bottom surface of said mounting section including said mounting surface, said bent section and said mounting section not contacting said molding compound.

16. The semiconductor package of claim 15 wherein said package includes a plurality of said electrical leads and a horizontal cross-sectional area of said heat slug is at least double a sum of horizontal cross-sectional areas of said bent sections of said plurality of said electrical leads.

17. The semiconductor package of claim 14 wherein an outside lateral surface of said electrical lead is flush with an outside lateral surface of said molding compound and said mounting surface of said electrical lead is flush with a bottom surface of said molding compound.

18. The semiconductor package of claim 17 wherein said package includes a plurality of said electrical leads and a horizontal cross-sectional area of said heat slug is at least double a sum of areas of said mounting surfaces of said plurality of said electrical leads.

19. The semiconductor package of claim 18 wherein said semiconductor package is a dual flat no-lead (DFN) package, a first group of said plurality of said electrical leads is arranged in a row along a first side of said semiconductor package, and a second group of said plurality of said electrical leads is arranged in a row along a second side of said semiconductor package opposite to said first side.

* * * * *